(12) United States Patent
Koppens et al.

(10) Patent No.: US 11,842,122 B2
(45) Date of Patent: *Dec. 12, 2023

(54) DYNAMIC RANGE CONTROL FOR A WIDE VARIETY OF PLAYBACK ENVIRONMENTS

(71) Applicants: DOLBY LABORATORIES LICENSING CORPORATION, San Francisco, CA (US); DOLBY INTERNATIONAL AB, Amsterdam (NL)

(72) Inventors: Jeroen Koppens, Nederweert (NL); Jeffrey Riedmiller, Novato, CA (US); Kristofer Kjoerling, Solna (SE); Alexander Stahlmann, Bubenreuth (DE); Holger Hoerich, Fürth (DE); Alan J. Seefeldt, Alameda, CA (US)

(73) Assignees: DOLBY LABORATORIES LICENSING CORPORATION, San Francisco, CA (US); DOLBY INTERNATIONAL AB, Dublin (IE)

( * ) Notice: Subject to any disclaimer, the term of this patent is extended or adjusted under 35 U.S.C. 154(b) by 0 days.

This patent is subject to a terminal disclaimer.

(21) Appl. No.: 17/898,358

(22) Filed: Aug. 29, 2022

(65) Prior Publication Data
US 2023/0075445 A1 Mar. 9, 2023

Related U.S. Application Data

(63) Continuation of application No. 17/209,046, filed on Mar. 22, 2021, now Pat. No. 11,429,341, which is a
(Continued)

(51) Int. Cl.
*G06F 3/16* (2006.01)
*G10L 19/16* (2013.01)
(Continued)

(52) U.S. Cl.
CPC ............ *G06F 3/165* (2013.01); *G10L 19/167* (2013.01); *G10L 21/0324* (2013.01);
(Continued)

(58) Field of Classification Search
CPC ... G06F 3/165; G10L 19/167; G10L 21/0324; H03G 3/3005; H03G 3/3089;
(Continued)

(56) References Cited

U.S. PATENT DOCUMENTS 5,297,236 A 3/1994 Antill
6,530,021 B1 3/2003 Epstein
(Continued)

FOREIGN PATENT DOCUMENTS

| CN | 1291377 A | 4/2001 |
|---|---|---|
| CN | 101156209 | 4/2008 |

(Continued)

OTHER PUBLICATIONS

"A Guide to Dolby Metadata" Jan. 1, 2005, pp. 1-28 (available at http://www.dolby.com/us/en/technologies/a-guide-to-dolby-metadata.pdf).
(Continued)

*Primary Examiner* — Paul Kim

(57) ABSTRACT

In an audio encoder, for audio content received in a source audio format, default gains are generated based on a default dynamic range compression (DRC) curve, and non-default gains are generated for a non-default gain profile. Based on the default gains and non-default gains, differential gains are generated. An audio signal comprising the audio content, the default DRC curve, and differential gains is generated. In an audio decoder, the default DRC curve and the differential gains are identified from the audio signal. Default gains are re-generated based on the default DRC curve. Based on the combination of the re-generated default gains and the dif-
(Continued)

ferential gains, operations are performed on the audio content extracted from the audio signal.

3 Claims, 13 Drawing Sheets

Related U.S. Application Data continuation of application No. 16/827,671, filed on Mar. 23, 2020, now Pat. No. 10,956,121, which is a continuation of application No. 16/387,073, filed on Apr. 17, 2019, now Pat. No. 10,606,550, which is a continuation of application No. 16/151,320, filed on Oct. 3, 2018, now Pat. No. 10,318,235, which is a continuation of application No. 14/916,509, filed as application No. PCT/US2014/054592 on Sep. 8, 2014, now Pat. No. 10,095,468.

(60) Provisional application No. 61/938,043, filed on Feb. 10, 2014, provisional application No. 61/891,324, filed on Oct. 15, 2013, provisional application No. 61/877,230, filed on Sep. 12, 2013.

(51) Int. Cl.
| | |
|---|---|
| *H03G 7/00* | (2006.01) |
| *H03G 9/00* | (2006.01) |
| *H03G 9/02* | (2006.01) |
| *H04S 7/00* | (2006.01) |
| *H03G 9/18* | (2006.01) |
| *H03G 3/30* | (2006.01) |
| *H03G 9/12* | (2006.01) |
| *H04S 1/00* | (2006.01) |
| *G10L 21/0324* | (2013.01) |

(52) U.S. Cl.
CPC ......... *H03G 3/3005* (2013.01); *H03G 3/3089* (2013.01); *H03G 7/002* (2013.01); *H03G 7/007* (2013.01); *H03G 9/005* (2013.01); *H03G 9/025* (2013.01); *H03G 9/12* (2013.01); *H03G 9/18* (2013.01); *H04S 1/00* (2013.01); *H04S 7/30* (2013.01); *H04S 2400/13* (2013.01)

(58) Field of Classification Search
CPC ........ H03G 7/002; H03G 7/007; H03G 9/005; H03G 9/025; H03G 9/12; H03G 9/18; H04S 1/00; H04S 7/30; H04S 2400/13
USPC ........................................................ 381/106
See application file for complete search history.

(56) References Cited

U.S. PATENT DOCUMENTS

| | | |
|---|---|---|
| 6,611,607 B1 | 8/2003 | Davis |
| 6,909,743 B1 | 6/2005 | Ward |
| 6,975,254 B1 | 12/2005 | Sperschneider |
| 7,072,477 B1 | 7/2006 | Kincaid |
| 7,369,906 B2 | 5/2008 | Frindle |
| 7,729,673 B2 | 6/2010 | Romesburg |
| 8,091,025 B2 | 1/2012 | Ramos |
| 8,204,756 B2 | 6/2012 | Kim |
| 8,285,791 B2 | 10/2012 | Ratcliff |
| 8,306,406 B2 | 11/2012 | Morita |
| 8,315,396 B2 | 11/2012 | Schreiner |
| 8,417,531 B2 | 4/2013 | Kim |
| 8,737,802 B2 | 5/2014 | Baek |
| 8,781,820 B2 | 7/2014 | Seguin |
| 8,903,098 B2 | 12/2014 | Tsuji |
| 8,903,729 B2 | 12/2014 | Riedmiller |
| 8,965,774 B2 | 2/2015 | Eppolito |
| 8,989,884 B2 | 3/2015 | Guetta |
| 9,240,763 B2 | 1/2016 | Baumgarte |
| 9,294,062 B2 | 3/2016 | Hatanaka |
| 9,300,268 B2 | 3/2016 | Chen |
| 9,372,531 B2 | 6/2016 | Benson |
| 9,542,952 B2 | 1/2017 | Hatanaka |
| 9,576,585 B2 | 2/2017 | Bleidt |
| 9,608,588 B2 | 3/2017 | Baumgarte |
| 9,633,663 B2 | 4/2017 | Heuberger |
| 9,830,915 B2 | 11/2017 | Schreiner |
| 9,836,272 B2 | 12/2017 | Kono |
| 10,368,181 B2 | 7/2019 | Ward |
| 10,993,062 B2 | 4/2021 | Ward |
| 2002/0001395 A1 | 1/2002 | Davis |
| 2002/0019733 A1 | 2/2002 | Erell |
| 2003/0123701 A1 | 7/2003 | Dorrell |
| 2004/0062267 A1 | 4/2004 | Minami |
| 2005/0172130 A1 | 8/2005 | Roberts |
| 2006/0018506 A1 | 1/2006 | Rodriguez |
| 2006/0106472 A1 | 5/2006 | Romesburg |
| 2007/0040934 A1 | 2/2007 | Ramaswamy et al. |
| 2007/0220168 A1 | 9/2007 | Parsons |
| 2007/0291959 A1 | 12/2007 | Seefeldt |
| 2008/0025530 A1 | 1/2008 | Romesburg |
| 2008/0059160 A1 | 3/2008 | Saunders |
| 2008/0080722 A1 | 4/2008 | Carroll |
| 2008/0267184 A1 | 10/2008 | Arisoylu |
| 2008/0288263 A1 | 11/2008 | Jung et al. |
| 2009/0063159 A1 | 3/2009 | Crockett |
| 2009/0080689 A1 | 3/2009 | Zhao |
| 2009/0097821 A1 | 4/2009 | Yahata |
| 2009/0210238 A1 | 8/2009 | Kim |
| 2009/0254339 A1 | 10/2009 | Seguin |
| 2010/0027837 A1 | 2/2010 | Levy |
| 2010/0076772 A1 | 3/2010 | Kim |
| 2010/0121647 A1 | 5/2010 | Beack et al. |
| 2010/0135507 A1 | 6/2010 | Kino |
| 2011/0002469 A1 | 1/2011 | Ojala |
| 2011/0013790 A1 | 1/2011 | Hilpert et al. |
| 2011/0150242 A1 | 6/2011 | Zong |
| 2011/0164855 A1 | 7/2011 | Crockett |
| 2011/0305344 A1 | 12/2011 | Sole |
| 2012/0016680 A1 | 1/2012 | Thesing |
| 2012/0033816 A1 | 2/2012 | Lee et al. |
| 2012/0046956 A1 | 2/2012 | Stewart |
| 2012/0057715 A1 | 3/2012 | Johnston |
| 2012/0063615 A1 | 3/2012 | Crockett |
| 2012/0065753 A1 | 3/2012 | Choo et al. |
| 2012/0110335 A1 | 5/2012 | Sandler |
| 2012/0130721 A1 | 5/2012 | Sirivara |
| 2012/0233467 A1 | 9/2012 | Whillock |
| 2012/0237039 A1 | 9/2012 | Thesing |
| 2012/0243692 A1 | 9/2012 | Ramamoorthy |
| 2012/0259643 A1 | 10/2012 | Engdegard et al. |
| 2012/0275625 A1 | 11/2012 | Kono |
| 2012/0310654 A1* | 12/2012 | Riedmiller ............ G10L 19/167 704/500 |
| 2012/0328115 A1 | 12/2012 | Wolters |
| 2013/0054251 A1 | 2/2013 | Eppolito |
| 2013/0094669 A1 | 4/2013 | Kono |
| 2013/0246077 A1 | 9/2013 | Riedmiller |
| 2014/0068274 A1 | 3/2014 | Kasatkin |
| 2014/0074783 A1 | 3/2014 | Alsina |
| 2014/0297291 A1 | 10/2014 | Baumgarte |
| 2014/0304515 A1 | 10/2014 | Feuerman |
| 2014/0310010 A1 | 10/2014 | Seo et al. |
| 2015/0025879 A1 | 1/2015 | Liu et al. |
| 2016/0196830 A1 | 7/2016 | Riedmiller |
| 2016/0225376 A1 | 8/2016 | Honma |
| 2016/0307580 A1 | 10/2016 | Riedmiller et al. |
| 2016/0315722 A1 | 10/2016 | Holman |
| 2016/0322060 A1 | 11/2016 | Riedmiller et al. |
| 2016/0351202 A1 | 12/2016 | Baumgarte |

(56) References Cited

U.S. PATENT DOCUMENTS

| | | | |
|---|---|---|---|
| 2017/0092280 A1 | 3/2017 | Hirabayashi | |
| 2017/0223429 A1 | 8/2017 | Schreiner | |

FOREIGN PATENT DOCUMENTS

| | | | |
|---|---|---|---|
| CN | 101167250 B | 4/2008 | |
| CN | 101189662 | 5/2008 | |
| CN | 101248484 | 8/2008 | |
| CN | 101390335 | 3/2009 | |
| CN | 101432965 B | 5/2009 | |
| CN | 101513009 | 8/2009 | |
| CN | 102203854 | 9/2011 | |
| CN | 102342020 A | 2/2012 | |
| CN | 102428514 | 4/2012 | |
| CN | 102483925 | 5/2012 | |
| CN | 102610229 | 7/2012 | |
| CN | 102668374 A | 9/2012 | |
| CN | 102682780 B | 9/2012 | |
| CN | 102687198 | 9/2012 | |
| CN | 102739178 A | 10/2012 | |
| CN | 102754151 A | 10/2012 | |
| CN | 102792588 | 11/2012 | |
| CN | 104995677 | 10/2015 | |
| EP | 2290564 | 3/2011 | |
| EP | 2341709 | 7/2011 | |
| EP | 3089161 | 11/2016 | |
| JP | 0746140 | 2/1995 | |
| JP | 11330980 | 11/1999 | |
| JP | 2003525466 | 8/2003 | |
| JP | 2009296298 A | 12/2009 | |
| JP | 2010508545 | 3/2010 | |
| JP | 2010537233 | 12/2010 | |
| JP | 2011030228 A | 2/2011 | |
| JP | 2011035459 | 2/2011 | |
| JP | 2012034295 | 2/2012 | |
| JP | 2012504260 | 2/2012 | |
| JP | 2013034295 | 2/2012 | |
| JP | 2013157659 A | 8/2013 | |
| JP | 3186472 | 10/2013 | |
| JP | 2015531498 | 11/2015 | |
| RU | 2183034 | 5/2002 | |
| RU | 2010154747 | 7/2012 | |
| WO | 02091361 | 11/2002 | |
| WO | 2006113062 | 10/2006 | |
| WO | 2011100155 | 8/2011 | |
| WO | 2011110525 | 9/2011 | |
| WO | 2011131732 | 10/2011 | |
| WO | 2012026092 | 3/2012 | |
| WO | 2012045816 | 4/2012 | |
| WO | 2012075246 | 6/2012 | |
| WO | 2013006338 | 1/2013 | |
| WO | 2013006342 | 1/2013 | |
| WO | 2013078056 | 5/2013 | |
| WO | 2014111290 | 7/2014 | |
| WO | 2014160849 | 10/2014 | |
| WO | 2014160895 | 10/2014 | |
| WO | 2015059087 | 4/2015 | |
| WO | 2015088697 | 6/2015 | |
| WO | 2015144587 | 10/2015 | |
| WO | 2015148046 A | 10/2015 | |
| WO | 2016075053 | 5/2016 | |
| WO | 2016002738 | 5/2017 | |

OTHER PUBLICATIONS

"ATSC Standard Digital Audio Compression (AC-3, E-AC-3)" Dec. 17, 2012, 270 pages.

"Practical Guidelines for Production and Implementation in Accordance with EBU R 128" Mar. 4, 2011, p. 26-39.

"SMPTE Registered Disclosure Document for Television—Description and Guide to the Use of the Dolby E Audio Metadata Serial Bitstream" Jan. 1, 2009, pp. 1-53.

"Specification of the Broadcast Wave Format: a format for Audio Data Files—Supplement 6: Dolby Metadata, EBU—Tech 3285 Suppl 6" Oct. 1, 2009, pp. 1-92.

107th MPEG San Jose (CA), USA, Jan. 13-17, 2014, Meeting Report Panos Kudumakis qMedia, Queen Mary University of London https://code.soundsoftware.ac.uk/attachments/download/1094/1PanosSanJose1-07MPEGMeetingReport.pdf (visited Mar. 18, 2018). cited by applicant, pp. 1-8.

108th MPEG Valencia, Spain, Mar. 31-Apr. 4, 2014, Meeting Report Panos Kudumakis qMedia, Queen Mary University of London https://code.soundsoftware.ac.uk/attachments/download/1119/1PanosValencia-108MPEGMeetingReport.pdf (visited Mar. 18, 2018). cited by applicant, pp. 1-9.

Ebu, "Digital Audio Compression (AC-3, Enhanced AC-3) Standard", ETSI TS 102 366, V1.2.1. Aug. 2008.

Rettelbach, N. "Proposed Update to the family of AAC LC Based Profiles" MPEG Meeting, ISO/IEC JTC1/SC29/WG11, Jul. 11, 2012, Stockholm, Sweden, pp. 1-20.

Norcross, S. et al "The Effect of Downmixing on Measured Loudness" AES presented at the 131st Convention, Oct. 20-23, 2011, New York, USA, pp. 1-4.

Lu Xugang Chen Daowen, A Nonlinear Dynamic Adaptive Auditory Model Based On I/O Characteristics For Forward Masking Effect, National Laboratory of Pattern Recognition the Institute of Automation Chinese Academy of Sciences, Dec. 1999, vol. 15—No. 4, China Academic Journal Electronic Publishing House, China, pp. 702-709.

Zhang Jun, Digitized Virtual Surround Sound Controller Based on PIC MCU, Computer Engineering Technical College, Guangdong Institute of Science and Technology, 2010, pp. 36-39, vol. 4, Guangzhou, China.

\* cited by examiner receive an audio signal that comprises audio content and definition data for dynamic range compression (DRC) curves and sets of differential gains 662 identify a specific set of differential gains for a gain profile and a default DRC curve related to the specific set of differential gains 664 generate a set of default gains based at least in part on the default DRC curve 666 based on a combination of the set of default gains and the specific set of differential gains, perform operations on portions of the audio content extracted from the audio signal 668

FIG. 6C

DYNAMIC RANGE CONTROL FOR A WIDE VARIETY OF PLAYBACK ENVIRONMENTS

CROSS REFERENCE TO RELATED APPLICATIONS

This application is continuation of U.S. patent application Ser. No. 17/209,046, filed Mar. 22, 2021, which is a continuation of U.S. patent application Ser. No. 16/827,671, filed Mar. 23, 2020, now U.S. Pat. No. 10,956,121, which is continuation of U.S. patent application Ser. No. 16/387,073, filed Apr. 17, 2019, now U.S. Pat. No. 10,606,550, which is continuation of U.S. patent application Ser. No. 16/151,320, filed Oct. 3, 2018, now U.S. Pat. No. 10,318,235, which is continuation of U.S. patent application Ser. No. 14/916,509, filed Mar. 3, 2016, now U.S. Pat. No. 10,095,468, which is U.S. National Stage Entry of PCT/US2014/054592, filed Sep. 8, 2014, which claims priority to U.S. Provisional Patent Application No. 61/877,230, filed Sep. 12, 2013, U.S. Provisional Patent Application No. 61/891,324, filed Oct. 15, 2013 and U.S. Provisional Patent Application No. 61/938,043, filed Feb. 10, 2014, each of which is hereby incorporated by reference in its entirety.

TECHNOLOGY

The present invention pertains generally to processing audio signals and pertains more specifically to techniques that may be used to applying dynamic range control and other types of audio processing operations to audio signals in any of a wide variety of playback environments.

BACKGROUND

The increasing popularity of media consumer devices has created new opportunities and challenges for the creators and distributors of media content for playback on those devices, as well as for the designers and manufacturers of the devices. Many consumer devices are capable of playing back a broad range of media content types and formats including those often associated with high-quality, wide bandwidth and wide dynamic range audio content for HDTV, Blu-ray or DVD. Media processing devices may be used to play back this type of audio content either on their own internal acoustic transducers or on external transducers such as headphones; however, they generally cannot reproduce this content with consistent loudness and intelligibility across varying media format and content types.

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section. Similarly, issues identified with respect to one or more approaches should not assume to have been recognized in any prior art on the basis of this section, unless otherwise indicated.

BRIEF DESCRIPTION OF DRAWINGS

The present invention is illustrated by way of example, and not by way of limitation, in the figures of the accompanying drawings and in which like reference numerals refer to similar elements and in which:

FIG. 6A through FIG. 6D illustrate example process flows; and

DESCRIPTION OF EXAMPLE EMBODIMENTS

Figure 1A:
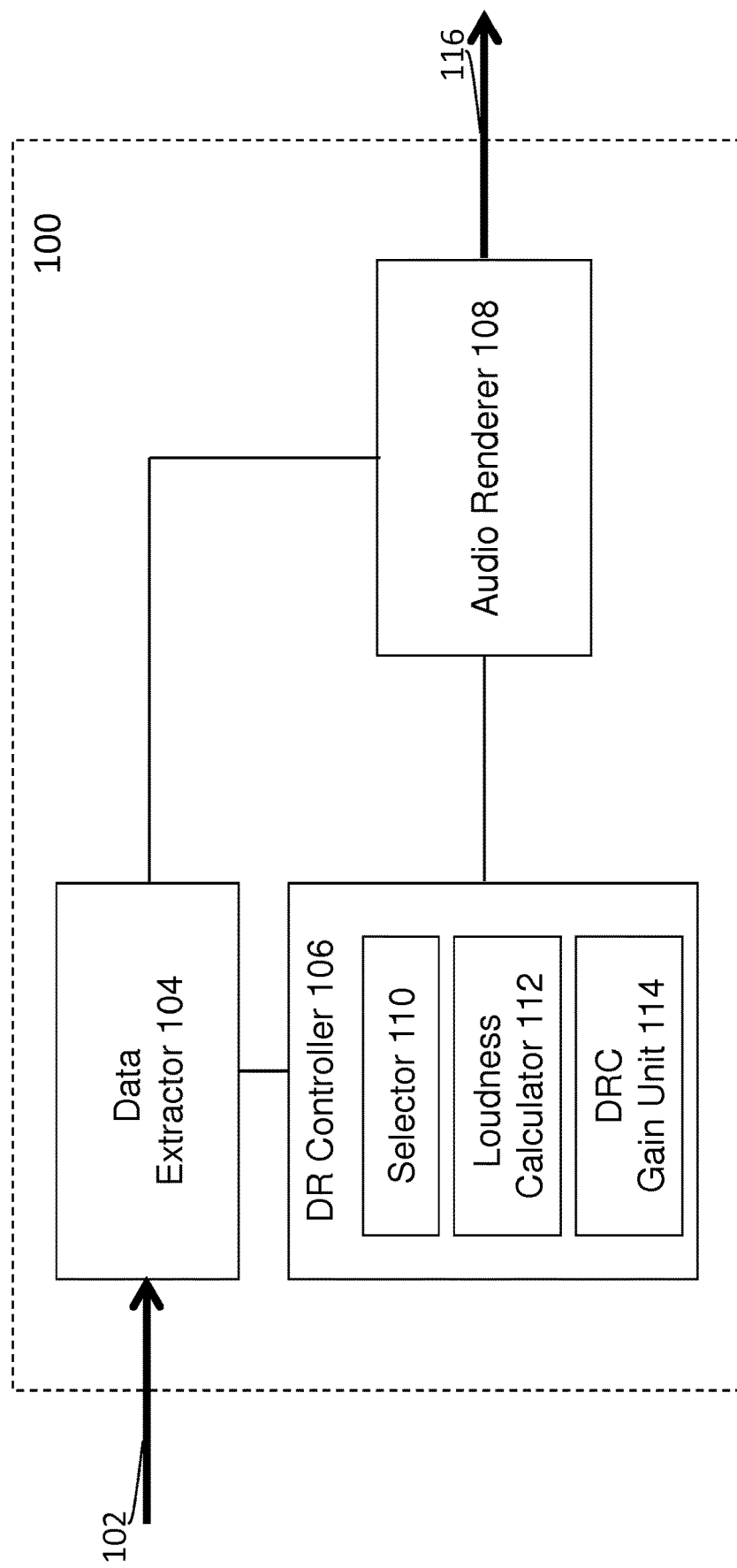
FIG. 1A and FIG. 1B illustrate an example audio decoder and an example audio encoder, respectively.

Example embodiments, which relate to applying dynamic range control and other types of audio processing operations to audio signals in any of a wide variety of playback environments, are described herein. In the following description, for the purposes of explanation, numerous specific details are set forth in order to provide a thorough understanding of the present invention. It will be apparent, however, that the present invention may be practiced without these specific details. In other instances, well-known structures and devices are not described in exhaustive detail, in order to avoid unnecessarily occluding, obscuring, or obfuscating the present invention.

Example embodiments are described herein according to the following outline:

1. GENERAL OVERVIEW
2. DYNAMIC RANGE CONTROL
3. AUDIO DECODER
4. AUDIO ENCODER
5. DYNAMIC RANGE COMPRESSION CURVES
6. DRC GAINS, GAIN LIMITING AND GAIN SMOOTHING
7. INPUT SMOOTHING AND GAIN SMOOTHING
8. DRC OVER MULTIPLE FREQUENCY BANDS
9. VOLUME ADJUSTMENT IN LOUDNESS DOMAIN
10. GAIN PROFILES WITH DIFFERENTIAL GAINS
11. ADDITIONAL OPERATIONS RELATED TO GAINS
12. SPECIFIC AND BROADBAND (OR WIDEBAND) LOUDNESS LEVELS
13. INDIVIDUAL GAINS FOR INDIVIDUAL SUBSETS OF CHANNELS
14. AUDITORY SCENE ANALYSIS
15. LOUDNESS LEVEL TRANSITIONS
16. RESET
17. ENCODER-PROVIDED GAINS
18. EXAMPLE SYSTEM AND PROCESS FLOWS
19. IMPLEMENTATION MECHANISMS—HARDWARE OVERVIEW
20. EQUIVALENTS, EXTENSIONS, ALTERNATIVES AND MISCELLANEOUS

1. General Overview

This overview presents a basic description of some aspects of an embodiment of the present invention. It should be noted that this overview is not an extensive or exhaustive summary of aspects of the embodiment. Moreover, it should be noted that this overview is not intended to be understood as identifying any particularly significant aspects or elements of the embodiment, nor as delineating any scope of the embodiment in particular, nor the invention in general.

This overview merely presents some concepts that relate to the example embodiment in a condensed and simplified format, and should be understood as merely a conceptual prelude to a more detailed description of example embodiments that follows below. Note that, although separate embodiments are discussed herein, any combination of embodiments and/or partial embodiments discussed herein may be combined to form further embodiments.

In some approaches, an encoder assumes that audio content is being encoded for a particular environment for the purpose of dynamic range control, and determines audio processing parameters such as gains for dynamic range control, etc., for the particular environment. The gains determined by the encoder under these approaches typically have been smoothed with some time constants (e.g., in an exponential decay function, etc.), over some time intervals, etc. In addition, the gains determined by the encoder under these approaches may have been incorporated for gain limiting which ensure signals to be no more than the clipping level for the assumed environment. Accordingly, the gains encoded with audio information into an audio signal by the encoder under these approaches are results of many different influences and irreversible. A decoder receiving the gains under these approaches would not be able to distinguish which part of the gains are for dynamic range control, which part of the gains are for gain smoothing, which part of the gains are for gain limiting, etc.

Under techniques as described herein, an audio encoder does not assume that only a specific playback environment at audio decoders needs to be supported. In an embodiment, the audio encoder transmits an encoded audio signal with audio content from which correct loudness levels (e.g., without clipping, etc.) can be determined. The audio encoder also transmits one or more dynamic range compression curves to the audio decoders. Any of the one or more dynamic range compression curves may be standard-based, proprietary, customized, content-provider-specific, etc. Reference loudness levels, attack times, release times, etc., may be transmitted by the audio encoder as a part of, or in conjunction with, the one or more dynamic range compression curves. Any of the reference loudness levels, attack times, release times, etc., may be standard-based, proprietary, customized, content-provider-specific, etc.

In some embodiments, the audio encoder implements auditory scene analysis (ASA) techniques, and uses the ASA techniques to detect auditory events in the audio content, and transmits one or more ASA parameters that describe the detected auditory events to the audio decoders.

In some embodiments, the audio encoder can also be configured to detect reset events in the audio content, and transmit indications of the reset events in a time-synchronous manner with the audio content to a downstream device such as an audio decoder, etc.

In some embodiments, the audio encoder can be configured to compute one or more sets of gains (e.g., DRC gains, etc.) for individual portions (e.g., audio data blocks, audio data frames, etc.) of the audio content and encode the sets of gains with the individual portions of the audio content into the encoded audio signal. In some embodiments, the sets of gains generated by the audio encoder correspond to one or more different gain profiles (e.g., those illustrated in TABLE 1, etc.). In some embodiments, Huffman coding, differential coding, etc., may be used to code the sets of gains into, or read the sets of gains from, components, subdivisions, etc., of audio data frames. These components, subdivision, etc., may be referred to as sub-frames in the audio data frames. Different sets of gains may correspond to different sets of sub-frames. Each set of gains, or each set of sub-frames, may comprise two or more temporal components (e.g., sub-frames, etc.). In some embodiments, a bitstream formatter in an audio encoder as described herein may write, with one or more for-loops, one or more sets of gains together as differential data codes into one or more sets of sub-frames in audio data frames; correspondingly, a bitstream parser in an audio decoder as described herein may read any of the one or more sets of gains coded as the differential data codes from the one or more sets of sub-frames in the audio data frames.

In some embodiments, the audio encoder determines dialogue loudness levels in audio content that is to be encoded into the encoded audio signal, and transmits the dialogue loudness levels with the audio content to the audio decoders.

In some embodiments, the audio encoder sends to downstream recipient audio decoders a default dynamic compression curve for a default gain profile in a playback environment or scenario. In some embodiments, an audio encoder assumes that downstream recipient audio decoders are to use a default dynamic compression curve for a default gain profile in a playback environment or scenario. In some embodiments, an audio encoder sends an indication to a downstream recipient audio decoder as to which of one or more dynamic compression curves (or gain profiles) defined at the downstream recipient audio decoder is to be used in a playback environment or scenario. In some embodiments, for each of one or more non-default gain profiles, the audio encoder sends a (e.g., non-default, etc.) dynamic compression curve corresponding to that non-default profile as a part of metadata carried by the encoded audio signal. Techniques as described herein allow multiple sets of differential gains related to a default compression curve to be generated by an upstream encoder and sent to a downstream decoder. This allows a great deal of freedom in DRC compressor (e.g., the process that calculates gains based on compression curves and smoothing operations, etc.) design in the decoder while keeping the required bitrate relatively low in comparison with transmitting full gain values. For the purpose of illustration only, a default profile or a default DRC curve has been mentioned as one in relation to which differential gains for a non-default profile or a non-default DRC curve can be specifically computed. However, this is for illustration purposes only; there is no strict need to distinguish between a default profile and a non-default profile (e.g., in a media data stream, etc.) as in various embodiments, all other profiles may be differential gains relative to the same specific (e.g., "default", etc.) compression curve. As used herein, a "gain profile" may refer to a DRC mode as an operation mode of a compressor that performs DRC operations. In some embodiments, DRC modes relate to specific types of playback devices (AVR vs. TV vs. tablet) and/or environments (noisy vs. quiet vs. late-night). Each DRC mode can be associated with a gain profile. A gain profile may be represented by definition data based on which a compressor performs DRC operations. In some embodiments, a gain profile can be a DRC curve (possibly parameterized) and time constants used in DRC operations. In some embodiments, a gain profile can be a set of DRC gains as an output of DRC operations in response to an audio signal. The profiles of different DRC modes may correspond to different amounts of compression.

In some embodiments, the audio encoder determines a set of default (e.g., full DRC and non-DRC, full DRC, etc.) gains for audio content based on the default dynamic range compression curve corresponding to the default gain profile, and for each of one or more non-default gain profiles, determines a set of non-default (e.g., full DRC and non-DRC, full DRC, etc.) gains for the same audio content. The audio encoder can then determine differences of gains between the set of default (e.g., full DRC and non-DRC, full DRC, etc.) gains for the default gain profile and the set of non-default (e.g., full DRC and non-DRC, full DRC, etc.) gains for the non-default gain profile, include the differences of gains in a set of differential gains, etc. Instead of sending a (e.g., non-default, etc.) dynamic compression curve for a non-default profile related to a non-default playback environment or scenario, the audio encoder can send a set of differential gains in place of, or in addition to, the non-default dynamic compression curve as a part of metadata carried by the encoded audio signal.

A set of differential gains may be smaller in size than a set of non-default (e.g., full DRC and non-DRC, full DRC, etc.) gains. Thus, transmitting differential gains rather than non-differential (e.g., full DRC and non-DRC, full DRC, etc.) gains may require a lower bitrate as compared with directly transmitting the non-differential (e.g., full DRC and non-DRC, full DRC, etc.) gains.

Audio decoders that receive the encoded audio signal as described herein may have been provided by different manufactures and are implemented with different components and designs. The audio decoders may have been released to end users at different times or may have been updated with different versions of hardware, software, firmware. As a result, the audio decoders may possess different audio processing capabilities. In some embodiments, a large number of audio decoders may be equipped with capabilities to support a limited set of gain profiles such as default gain profiles specified by standards, proprietary requirements, etc. A large number of audio decoders may be configured with capabilities to perform relevant gain generation operations to generate, based on a default dynamic range compression curve representing a default gain profile, gains for the default gain profile. Transmitting a default dynamic range compression curve for the default gain profile in an audio signal may be more efficient than transmitting gains generated/computed for the default gain profile in the audio signal.

On the other hand, for non-default gain profiles, the audio encoder can pre-generate differential gains in reference to a specific default dynamic range compression curve that corresponds to a specific default gain profile. In response to receiving the differential gains in an audio signal generated by the audio encoder, an audio decoder can generate default gains based on a default dynamic range compression curve as received in the audio signal, combine the received differential gains and the generated default gains into non-default gains for a non-default gain profile, apply the non-default gains to audio content decoded from the audio signal, etc., while rendering the received audio content. In some embodiments, a non-default gain profile may be used to compensate limitations of a default dynamic range compression curve.

Techniques as described herein can be used to provide flexible support for new gain profiles, features or enhancements. In some embodiments, at least one gain profile cannot be easily represented with a dynamic range compression curve, default or non-default. In some embodiments, at least one gain profile may be specific to particular audio content (e.g., a particular movie, etc.). It is also possible that a representation (e.g., parameterized DRC curves, smoothing constants, etc.) of a non-default gain profile may need transmitting more parameters, smoothing constants, etc., in an encoded audio signal than what can be carried in the encoded audio signal. In some embodiments, at least one gain profile may be specific to particular audio content provider (e.g., a particular studio, etc.).

Thus, an audio encoder as described herein can take a lead in supporting a new gain profile by implementing gain generation operations for the new gain profile as well as gain generation operations for a default gain profile to which the new gain profile is related. A downstream recipient audio decoder does not have to the gain generation operations for the new gain profile. Rather, the audio decoder can support the new gain profile by taking advantages of the non-default differential gains generated by the audio encoder without the audio decoder to perform the gain generation operations for the new gain profile.

In some embodiments, in profile related metadata encoded in an encoded audio signal, one or more (e.g., default, etc.) dynamic range compression curves and one or more sets of (e.g., non-default, etc.) differential gains are structured, indexed, etc., for example, according to respective gain profiles to which the one or more (e.g., default, etc.) dynamic range compression curves and one or more sets of (e.g., non-default, etc.) differential gains correspond. In some embodiments, a relationship between a set of non-default differential gains and a default dynamic range compression curve may be indicated in the profile related metadata. This may be particularly useful when two or more default dynamic range compression curves exist in the metadata; or not in the metadata but defined in a downstream decoder, based on the relationship indicated in the profile related metadata, a recipient audio decoder can determine which default dynamic range compression curve is to be used to generate a set of default gains, which can then be combined with a received set of non-default differential gains for the purpose of generating non-default gains, for example, to compensate the limitations of the default dynamic range compression curve.

Techniques as described herein do not require audio decoders to be locked in with (e.g., irreversible, etc.) audio processing which may have been performed by an upstream device such as an audio encoder, etc., while assuming a hypothetic playback environment, scenario, etc., at a hypothetic audio decoder. The decoder as described herein may be configured to customize the audio processing operations based on a specific playback scenario, for example, in order to differentiate different loudness levels existing in audio content, minimize loss of audio perceptual quality at or near boundary loudness levels (e.g., minimum or maximum loudness levels, etc.), maintain spatial balance among channels or subsets of channels, etc.

An audio decoder that receives the encoded audio signal with the dynamic range compression curves, reference loudness levels, attack times, release times, etc., can determine a specific playback environment that is in use at the decoder, and select a specific compression curve with a corresponding reference loudness level corresponding to the specific playback environment.

The decoder can compute/determine loudness levels in individual portions (e.g., audio data blocks, audio data frames, etc.) of the audio content extracted from the encoded audio signal, or obtain the loudness levels in the individual portions of the audio content if the audio encoder has computed and provided the loudness levels in the encoded audio signal. Based on one or more of the loudness levels in the individual portions of the audio content, loudness levels in previous portions of the audio content, loudness levels in subsequent portions of the audio content if available, the specific compression curve, a specific profile related to the specific playback environment or scenario, etc., the decoder determines audio processing parameters such as gains for dynamic range control (or DRC gains), attack times, release times, etc. The audio processing parameters also can include adjustments for aligning dialogue loudness levels to a specific reference loudness level (which may be user adjustable) for the specific playback environment.

The decoder applies audio processing operations including (e.g., multi-channel, multi-band, etc.) dynamic range control, dialogue level adjustments, etc., with the audio processing parameters. The audio processing operations performed by the decoder may further include but are not limited to only: gain smoothing based on the attack and release times provided as a part of, or in conjunction with, the selected dynamic range compression curve, gain limiting for preventing clipping, etc. Different audio processing operations may be performed with different (e.g., adjustable, threshold-dependent, controllable, etc.) time constants. For example, gain limiting for preventing clipping may be applied to individual audio data blocks, individual audio data frames, etc., with relatively short time constants (e.g., instantaneous, approximately 5.3 milliseconds, etc.).

In some embodiments, the decoder can be configured to extract ASA parameters (e.g., temporal locations of auditory event boundaries, time-dependent values of an event certainty measure, etc.) from metadata in an encoded audio signal, and control the speed of gain smoothing in auditory events based on the extracted ASA parameters (e.g., use short time constants for attacks at auditory events boundaries, use long time constants to slow down gain smoothing within an auditory event, etc.).

In some embodiments, the decoder also maintains a histogram of instantaneous loudness levels for a certain time interval or window, and uses the histogram to control the speed of gain changes in loudness level transitions between programs, between a program and a commercial, etc., for example, by modifying the time constants.

In some embodiments, the decoder supports more than one speaker configuration (e.g., portable mode with speakers, portable mode with headphones, stereo mode, multi-channel mode, etc.). The decoder may be configured to maintain the same loudness levels between two different speaker configurations (e.g., between a stereo mode and a multi-channel mode, etc.), for example, when playing back the same audio content. The audio decoder may use one or more downmix equations to downmix multi-channel audio content, as received from an encoded audio signal for a reference speaker configuration for which the multi-channel audio content was coded to a specific speaker configuration at the audio decoder.

In some embodiments, automatic gain control (AGC) may be disabled in an audio decoder as described herein.

In some embodiments, mechanisms as described herein form a part of a media processing system, including but not limited to: an audiovisual device, a flat panel TV, a handheld device, game machine, television, home theater system, tablet, mobile device, laptop computer, netbook computer, cellular radiotelephone, electronic book reader, point of sale terminal, desktop computer, computer workstation, computer kiosk, various other kinds of terminals and media processing units, etc.

Various modifications to the preferred embodiments and the generic principles and features described herein will be readily apparent to those skilled in the art. Thus, the disclosure is not intended to be limited to the embodiments shown, but is to be accorded the widest scope consistent with the principles and features described herein.

2. Dynamic Range Control

Without customized dynamic range control, input audio information (e.g., PCM samples, time-frequency samples in a QMF matrix, etc.) is often reproduced at a playback device at loudness levels that are inappropriate for the playback device's specific playback environment (that is, including the device's physical and/or mechanical playback limitations), as the playback device's specific playback environment might be different from a target playback environment for which the encoded audio content had been coded at an encoding device.

Techniques as described herein can be used to support dynamic range control of a wide variety of audio content customized to any of a wide variety of playback environments while maintaining perceptual qualities of the audio content.

Dynamic Range Control (DRC) refers to time-dependent audio processing operations that alter (e.g., compress, cut, expand, boost, etc.) an input dynamic range of loudness levels in audio content into an output dynamic range that is different from the input dynamic range. For example, in a dynamic range control scenario, soft sounds may be mapped (e.g., boosted, etc.) to higher loudness levels and loud sounds may be mapped (e.g., cut, etc.) to lower loudness values. As a result, in a loudness domain, an output range of loudness levels becomes smaller than the input range of loudness levels in this example. In some embodiments, the dynamic range control, however, may be reversible so that the original range is restored. For example, an expansion operation may be performed to recover the original range so long as mapped loudness levels in the output dynamic range, as mapped from original loudness levels, are at or below a clipping level, each unique original loudness level is mapped to a unique output loudness level, etc.

DRC techniques as described herein can be used to provide a better listening experience in certain playback environments or situations. For example, soft sounds in a noisy environment may be masked by the noise that renders the soft sounds inaudible. Conversely, loud sounds may not be desired in some situations, for example, bothering neighbors. Many devices, typically with small form-factor loudspeakers, cannot reproduce sound at high output levels. In some cases the lower signal levels may be reproduced below the human hearing threshold. The DRC techniques may perform mapping of input loudness levels to output loudness levels based on DRC gains (e.g., scaling factors that scale audio amplitudes, boost ratios, cut ratios, etc.) looked up with a dynamic range compression curve.

A dynamic range compression curve refers to a function (e.g., a lookup table, a curve, a multi-segment piecewise lines, etc.) that maps individual input loudness levels (e.g., of sounds other than dialogues, etc.) as determined from individual audio data frames to individual gains or gains for dynamic range control. Each of the individual gains indicates an amount of gain to be applied to a corresponding individual input loudness level. Output loudness levels after applying the individual gains represent target loudness levels for audio content in the individual audio data frames in a specific playback environment.

In addition to specifying mappings between gains and loudness levels, a dynamic range compression curve may include, or may be provided with, specific release times and attack times in applying specific gains. An attack refers to an increase of signal energy (or loudness) between successive time samples, whereas a release refers to a decrease of energy (or loudness) between successive time samples. An attack time (e.g., 10 milliseconds, 20 milliseconds, etc.) refers to a time constant used in smoothing DRC gains when the corresponding signal is in attack mode. A release time (e.g., 80 milliseconds, 100 milliseconds, etc.) refers to a time constant used in smoothing DRC gains when the corresponding signal is in release mode. In some embodiments, additionally, optionally or alternatively, the time constants are used for smoothing of the signal energy (or loudness) prior to determining the DRC gain.

Different dynamic range compression curves may correspond to different playback environments. For example, a dynamic range compression curve for a playback environment of a flat panel TV may be different from a dynamic range compression curve for a playback environment of a portable device. In some embodiments, a playback device may have two or more playback environments. For example, a first dynamic range compression curve for a first playback environment of a portable device with speakers may be different from a second dynamic range compression curve for a second playback environment of the same portable device with headset.

3. Audio Decoder

FIG. 1A illustrates an example audio decoder 100 comprising a data extractor 104, dynamic range controller 106, an audio renderer 108, etc.

In some embodiments, the data extractor (104) is configured to receive an encoded input signal 102. An encoded input signal as described herein may be a bit stream that contains encoded (e.g., compressed, etc.) input audio data frames and metadata. The data extractor (104) is configured to extract/decode input audio data frames and metadata from the encoded input signal (102). Each of the input audio data frames comprises a plurality of coded audio data blocks each of which represents a plurality of audio samples. Each frame represents a (e.g., constant) time interval comprising a certain number of audio samples. The frame size may vary with the sample rate and coded data rate. The audio samples are quantized audio data elements (e.g., input PCM samples, input time-frequency samples in a QMF matrix, etc.) representing spectral content in one, two or more (audio) frequency bands or frequency ranges. The quantized audio data elements in the input audio data frames may represent pressure waves in a digital (quantized) domain. The quantized audio data elements may cover a finite range of loudness levels at or below a largest possible value (e.g., a clipping level, a maximum loudness level, etc.).

The metadata can be used by a wide variety of recipient decoder to process the input audio data frames. The metadata may include a variety of operational parameters relating to one or more operations to be performed by the decoder (100), one or more dynamic range compression curves, normalization parameters relating to dialogue loudness levels represented in the input audio data frames, etc. A dialogue loudness level may refer to a (e.g., psychoacoustic, perceptual, etc.) level of dialogue loudness, program loudness, average dialogue loudness, etc., in an entire program (e.g., a movie, a TV program, a radio broadcast, etc.), a portion of a program, a dialogue of a program, etc.

The operation and functions of the decoder (100), or some or all of the modules (e.g., the data extractor 104, the dynamic range controller 106, etc.), may be adapted in response to the metadata extracted from the encoded input signal (102). For example, the metadata—including but not limited to dynamic range compression curves, dialogue loudness levels, etc. —may be used by the decoder (100) to generate output audio data elements (e.g., output PCM samples, output time-frequency samples in a QMF matrix, etc.) in the digital domain. The output data elements can then be used to drive audio channels or speakers to achieve a specified loudness or reference reproduction level during playback in a specific playback environment.

In some embodiments, the dynamic range controller (106) is configured to receive some or all of the audio data elements in the input audio data frames and the metadata, perform audio processing operations (e.g., dynamic range control operations, gain smoothing operations, gain limiting operations, etc.) on the audio data elements in the input audio data frames based at least in part on the metadata extracted from the encoded audio signal (102), etc.

In some embodiments, the dynamic range controller (106) may comprise a selector 110, a loudness calculator 112, DRC gain unit 114, etc. The selector (110) may be configured to determine a speaker configuration (e.g., flat panel mode, portable device with speakers, portable device with headphones, a 5.1 speaker configuration, a 7.1 speaker configuration, etc.) relating to a specific playback environment at the decoder (100), select a specific dynamic range compression curve from the dynamic range compression curves extracted from the encoded input signal (102), etc.

The loudness calculator (112) may be configured to calculate one or more types of loudness levels as represented by the audio data elements in the input audio data frames. Examples of types of loudness levels include, but are not limited only to: any of individual loudness levels over individual frequency bands in individual channels over individual time intervals, broadband (or wideband) loudness levels over a broad (or wide) frequency range in individual channels, loudness levels as determined from or smoothed over an audio data block or frame, loudness levels as determined from or smoothed over more than one audio data block or frame, loudness levels smoothed over one or more time intervals, etc. Zero, one or more of these loudness levels may be altered for the purpose of dynamic range control by the decoder (100).

To determine the loudness levels, the loudness calculator (112) can determine one or more time-dependent physical sound wave properties such as spatial pressure levels at specific audio frequencies, etc., as represented by the audio data elements in the input audio data frames. The loudness calculator (112) can use the one or more time-varying physical wave properties to derive one or more types of loudness levels based on one or more psychoacoustic functions modeling human loudness perception. A psychoacoustic function may be a non-linear function—as constructed based on a model of the human auditory system—that converts/maps specific spatial pressure levels at specific audio frequencies to specific loudness for the specific audio frequencies, etc.

A (e.g., broadband, wideband, etc.) loudness level over multiple (audio) frequencies or multiple frequency bands may be derived through integration of specific loudness level over the multiple (audio) frequencies or multiple frequency bands. Time-averaged, smoothed, etc., loudness levels over one or more time intervals (e.g., longer than that represented by audio data elements in an audio data block or frame, etc.) may be obtained by using one or more smoothing filters that are implemented as a part of the audio processing operations in the decoder (100).

In an example embodiment, specific loudness levels for different frequency bands may be calculated per audio data block of certain (e.g., 256, etc.) samples. Pre-filters may be used to apply frequency weighting (e.g., similar to IEC B-weighting, etc.) to the specific loudness levels in integrating the specific loudness levels into a broadband (or wideband) loudness level. A summation of broad loudness levels over two or more channels (e.g., left front, right front, center, left surround, right surround, etc.) may be performed to provide an overall loudness level of the two or more channels.

In some embodiments, an overall loudness level may refer to a broadband (wideband) loudness level in a single channel (e.g., center, etc.) of a speaker configuration. In some embodiments, an overall loudness level may refer to a broadband (or wideband) loudness level in a plurality of channels. The plurality of channels may be all channels in a speaker configuration. Additionally, optionally or alternatively, the plurality of channels may comprise a subset of channels (e.g., a subset of channels comprising left front, right front, and low frequency effect (LFE); a subset of channels comprising left surround and right surround; a subset of channels comprising center; etc.) in a speaker configuration.

A (e.g., broadband, wideband, overall, specific, etc.) loudness level may be used as input to look up a corresponding (e.g., static, pre-smoothing, pre-limiting, etc.) DRC gain from the selected dynamic range compression curve. The loudness level to be used as input to look up the DRC gain may be first adjusted or normalized with respect to a dialogue loudness level from the metadata extracted from the encoded audio signal (102). In some embodiments, the adjustments and normalization related to adjusting the dialogue loudness level may, but is not limited to, be performed on a portion of the audio content in the encoded audio signal (102) in a non-loudness domain (e.g., a SPL domain, etc.), before specific spatial pressure levels represented in the portion of the audio content in the encoded audio signal (102) are converted or mapped to specific loudness levels of the portion of the audio content in the encoded audio signal (102).

In some embodiments, the DRC gain unit (114) may be configured with a DRC algorithm to generate gains (e.g., for dynamic range control, for gain limiting, for gain smoothing, etc.), apply the gains to one or more loudness levels in the one or more types of loudness levels represented by the audio data elements in the input audio data frames to achieve target loudness levels for the specific playback environment, etc. The application of gains as described herein (e.g., DRC gains, etc.) may, but is not required to, happen in the loudness domain. In some embodiments, gains may be generated based on the loudness calculation (which may be in Sone or just the SPL value compensated for the dialog loudness level, for example, with no conversion), smoothed and applied directly to the input signal. In some embodiments, techniques as described herein may apply the gains to a signal in the loudness domain, and then convert the signal from the loudness domain back to the (linear) SPL domain and calculate corresponding gains that are to be applied to the signal by assessing the signal before and after the gain was applied to the signal in the loudness domain. The ratio (or difference when represented in a logarithmic dB representation) then determines the corresponding gain for the signal.

In some embodiments, the DRC algorithm operates with a plurality of DRC parameters. The DRC parameters include the dialogue loudness level that has already been computed and embedded into the encoded audio signal (102) by an upstream encoder (e.g., 150, etc.) and can be obtained from the metadata in the encoded audio signal (102) by the decoder (100). The dialogue loudness level from the upstream encoder indicates an average dialogue loudness level (e.g., per program, relative to the energy of a full-scale 1 kHz sine wave, relative to the energy of a reference rectangular wave, etc.). In some embodiments, the dialogue loudness level extracted from the encoded audio signal (102) may be used to reduce inter-program loudness level differences. In an embodiment, the reference dialogue loudness level may be set to the same value between different programs in the same specific playback environment at the decoder (100). Based on the dialogue loudness level from the metadata, the DRC gain unit (114) can apply a dialogue loudness related gain to each audio data block in a program such that an output dialogue loudness level averaged over a plurality of audio data blocks of the program is raised/lowered to a (e.g., pre-configured, system default, user-configurable, profile dependent, etc.) reference dialogue loudness level for the program.

In some embodiments, the DRC gains may be used to address intra-program loudness level differences by boosting or cutting signal portions in soft and/or loud sounds in accordance with the selected dynamic range compression curve. One or more of these DRC gains may be computed/determined by the DRC algorithm based on the selected dynamic range compression curve and (e.g., broadband, wideband, overall, specific, etc.) loudness levels as determined from one or more of the corresponding audio data blocks, audio data frames, etc.

Loudness levels used to determine (e.g., static, pre-smoothing, pre-gain limiting, etc.) DRC gains by looking up the selected dynamic range compression curve may be calculated on short intervals (e.g., approximately 5.3 milliseconds, etc.). The integration time of the human auditory system (e.g., approximately 200 milliseconds, etc.) may be much longer. The DRC gains obtained from the selected dynamic range compression curve may be smoothed with a time constant to take into account the long integration time of the human auditory system. To effectuate fast rates of changes (increases or decreases) in loudness levels, short time constants may be used to cause changes in loudness levels in short time intervals corresponding to the short time constants. Conversely, to effectuate slow rates of changes (increases or decreases) in loudness levels, long time constants may be used to changes in loudness levels in long time intervals corresponding to the long time constants.

The human auditory system may react to increasing loudness levels and decreasing loudness levels with different integration time. In some embodiments, different time constants may be used for smoothing the static DRC gains looked up from the selected dynamic range compression curves, depending on whether the loudness level will be increasing or decreasing. For example, in correspondence with the characteristics of the human auditory system, attacks (loudness level increasing) are smoothed with relatively short time constants (e.g., attack times, etc.), whereas releases (loudness level decreasing) are smoothed with relatively long time constants (e.g., release time, etc.).

A DRC gain for a portion (e.g., one or more of audio data blocks, audio data frames, etc.) of audio content may be calculated using a loudness level determined from the portion of audio content. The loudness level to be used for looking up in the selected dynamic range compression curve may be first adjusted with respect to (e.g., in relation to, etc.) a dialogue loudness level (e.g., in a program of which the audio content is a part, etc.) in the metadata extracted from the encoded audio signal (102).

A reference dialogue loudness level (e.g., −31 $dB_{FS}$ in the "Line" mode, −20 $dB_{FS}$ in the "RF" mode, etc.) may be specified or established for the specific playback environment at the decoder (100). Additionally, alternatively or optionally, in some embodiments, users may be given control over setting or changing the reference dialogue loudness level at the decoder (100).

The DRC gain unit (114) can be configured to determine a dialogue loudness related gain to the audio content to cause a change from the input dialogue loudness level to the reference dialogue loudness level as the output dialogue loudness level.

In some embodiments, the DRC gain unit (114) may be configured to handle peak levels in the specific playback environment at the decoder (100) and adjusts the DRC gains to prevent clipping. In some embodiments, under a first approach, if the audio content extracted from the encoded audio signal (102) comprise audio data elements for a reference multi-channel configuration with more channels than those of the specific speaker configuration at the decoder (100), downmixing from the reference multi-channel configuration to the specific speaker configuration may be performed before determining and handle peak levels for the purpose of clipping prevention. Additionally, optionally, or alternatively, in some embodiments, under a second approach, if the audio content extracted from the encoded audio signal (102) comprise audio data elements for a reference multi-channel configuration with more channels than those of the specific speaker configuration at the decoder (100), downmix equations (e.g., ITU stereo downmix, matrixed-surround compatible downmix, etc.) may be used to obtain the peak levels for the specific speaker configuration at the decoder (100). The peak level may be adjusted to reflect the change from the input dialogue loudness level to the reference dialogue loudness level as the output dialogue loudness level. A maximum allowed gain without causing clipping (e.g., for an audio data block, for an audio data frame, etc.) may be determined based at least in part on an inverse (e.g., multiplied with −1, etc.) of the peak level. Thus, an audio decoder under techniques as described herein can be configured to determine peak levels accurately and apply clipping prevention specifically for the playback configuration at the decoder side; neither the audio decoder nor the audio encoder is required to make hypothetical assumptions about any worst-case scenarios at hypothetical decoders. In particular, the decoder in the first approach as described above can determine peak levels accurately and apply clip prevention after downmixing without using downmixing equations, downmix channel gains, etc., which would be used under the second approach as described above.

In some embodiments, a combination of the adjustments to the dialogue loudness level and the DRC gain prevents clipping in the peak level, possibly even in the worst-case downmix (e.g., producing the largest peak levels after downmixing, producing the largest downmix channel gains, etc.). However, in some other embodiments, the combination of the adjustments to the dialogue loudness level and the DRC gain may still not be sufficient in preventing clipping in the peak level. In these embodiments, the DRC gain may be replaced (e.g., capped, etc.) by the highest gain that does prevent clipping in the peak level.

In some embodiments, the DRC gain unit (114) is configured to get time constants (e.g., attack times, release times, etc.) from the metadata extracted from the encoded audio signal (102). The DRC gain, the time constants, the maximum allowed gain, etc., may be used by the DRC gain unit (114) to perform DRC, gain smoothing, gain limiting, etc.

For example, the application of the DRC gain may be smoothed with a filter controlled by a time constant. A gain limiting operation may be implemented by a min( ) function that takes the lower of a gain to be applied and a maximum allowed gain for the gain, through which the (e.g., prelimiting, DRC, etc.) gain may be replaced immediately, over a relatively short time interval, etc., with the maximum allowed gain, thereby preventing clipping.

In some embodiments, the audio renderer (108) is configured to generate (e.g., multi-channel, etc.) channel-specific audio data (116) for the specific speaker configuration after applying gains as determined based on DRC, gain limiting, gain smoothing, etc., to the input audio data extracted from the encoded audio signal (102). The channel-specific audio data (118) may be used to drive speakers, headphones, etc., represented in the speaker configuration.

Additionally and/or optionally, in some embodiments, the decoder (100) can be configured to perform one or more other operations relating to preprocessing, post-processing, rendering, etc., relating to the input audio data.

Techniques as described herein can be used with a variety of speaker configurations corresponding to a variety of different surround sound configurations (e.g., 2.0, 3.0, 4.0, 4.1, 4.1, 5.1, 6.1, 7.1, 7.2, 10.2, a 10-60 speaker configuration, a 60+ speaker configuration, object signals or combinations of object signals, etc.) and a variety of different rendering environment configurations (e.g., cinema, park, opera houses, concert halls, bars, homes, auditoriums, etc.).

4. Audio Encoder

Figure 1B:
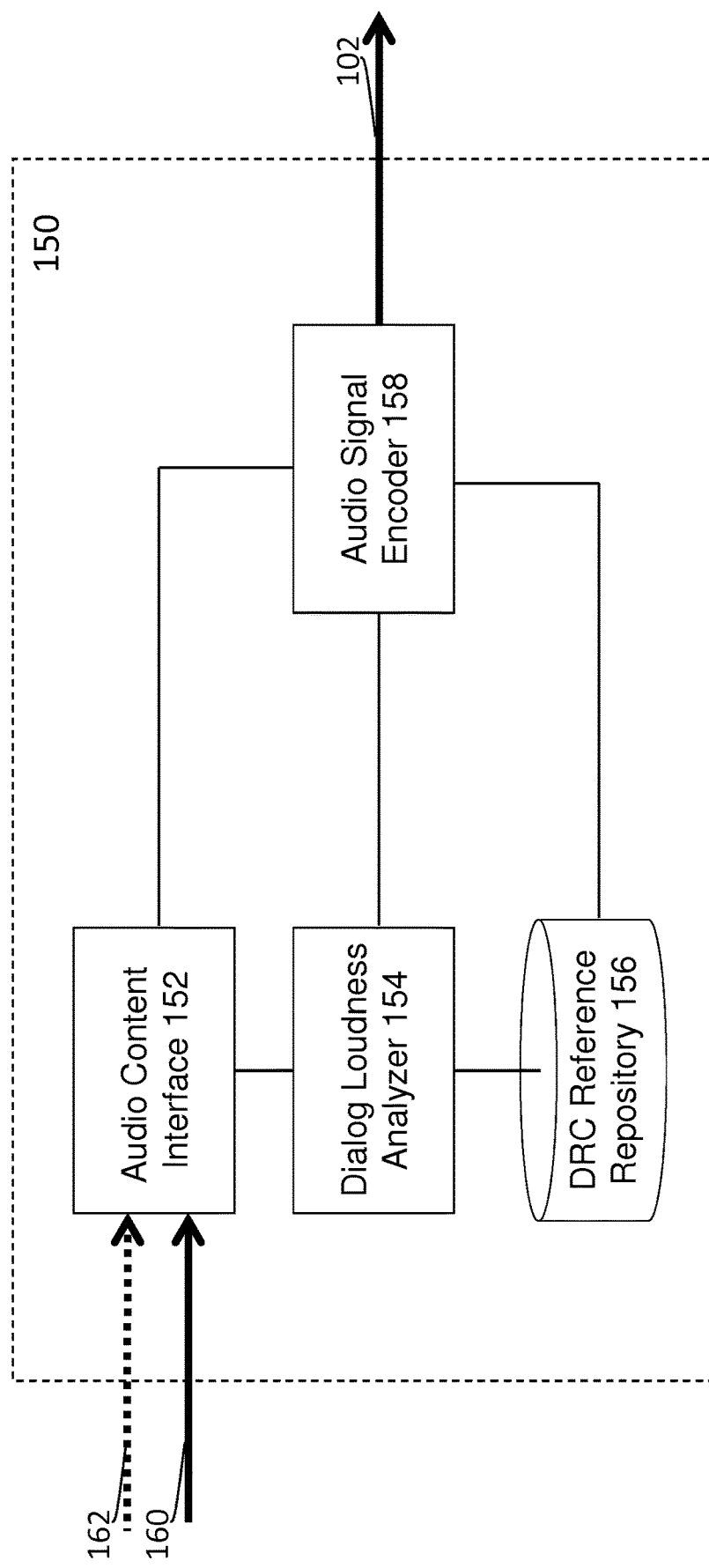

FIG. 1B illustrates an example encoder 150. The encoder (150) may comprise an audio content interface 152, a dialogue loudness analyzer 154, a DRC reference repository 156, an audio signal encoder 158, etc. The encoder 150 may be a part of a broadcast system, an internet-based content server, an over-the-air network operator system, a movie production system, etc.

In some embodiments, the audio content interface (152) is configured to receive audio content 160, audio content control input 162, etc., generate an encoded audio signal (e.g., 102) based at least on some or all of the audio content (160), the audio content control input (162), etc. For example, the audio content interface (152) may be used to receive the audio content (160), the audio content control input (162) from a content creator, a content provider, etc.

The audio content (160) may constitute some or all of overall media data that comprises audio only, audiovisual, etc. The audio content (160) may comprise one or more of portions of a program, a program, several programs, one or more commercials, etc.

In some embodiments, the dialogue loudness analyzer (154) is configured to determine/establish one or more dialogue loudness levels of one or more portions (e.g., one or more programs, one or more commercials, etc.) of the audio content (152). In some embodiments, the audio content is represented by one or more sets of audio tracks. In some embodiments, dialogue audio content of the audio content is in separate audio tracks. In some embodiments, at least a portion of dialogue audio content of the audio content is in audio tracks comprising non-dialogue audio content.

The audio content control input (162) may comprise some or all of user control input, control input provided by a system/device external to the encoder (150), control input from a content creator, control input from a content provider, etc. For example, a user such as a mixing engineer, etc., can provide/specify one or more dynamic range compression curve identifiers; the identifiers may be used to retrieve one or more dynamic range compression curves that fit the audio content (160) best from a data repository such as a DRC reference repository (156), etc.

In some embodiments, the DRC reference repository (156) is configured to store DRC reference parameter sets, etc. The DRC reference parameter sets may include definition data for one or more dynamic range compression curves, etc. In some embodiments, the encoder (150) may (e.g., concurrently, etc.) encode more than one dynamic range compression curve into the encoded audio signal (102). Zero, one, or more of the dynamic range compression curves may be standard-based, proprietary, customized, decoder-modifiable, etc. In an example embodiment, both dynamic range compression curves of FIG. 2A and FIG. 2B can be (e.g., concurrently, etc.) encoded into the encoded audio signal (102).

In some embodiments, the audio signal encoder (158) can be configured to receive the audio content from the audio content interface (152), the dialogue loudness levels from the dialogue loudness analyzer (154), etc., retrieve one or more DRC reference parameter sets from the DRC reference repository (156), format audio content into audio data blocks/frames, format the dialogue loudness levels, the DRC reference parameter sets, etc., into metadata (e.g., metadata containers, metadata fields, metadata structures, etc.), encode the audio data blocks/frames and the metadata into the encoded audio signal (102), etc.

audiovisual broadcast, etc.). The media data bitstream can be accessed from a server, a computer, a media storage device, a media database, a media file, etc. The media data bit stream may be broadcasted, transmitted or received through one or more wireless or wired network links. A media data bitstream may also be communicated through an intermediary such as one or more network connections, USB connections, wide area networks, local area networks, wireless connections, optical connections, buses, crossbar connections, serial connections, etc.

Any of the components depicted (e.g., FIG. 1A, FIG. 1B, etc.) may be implemented as one or more processes and/or one or more IC circuits (e.g., ASICs, FPGAs, etc.), in hardware, software, or a combination of hardware and software.

5. Dynamic Range Compression Curves

Figure 2A:
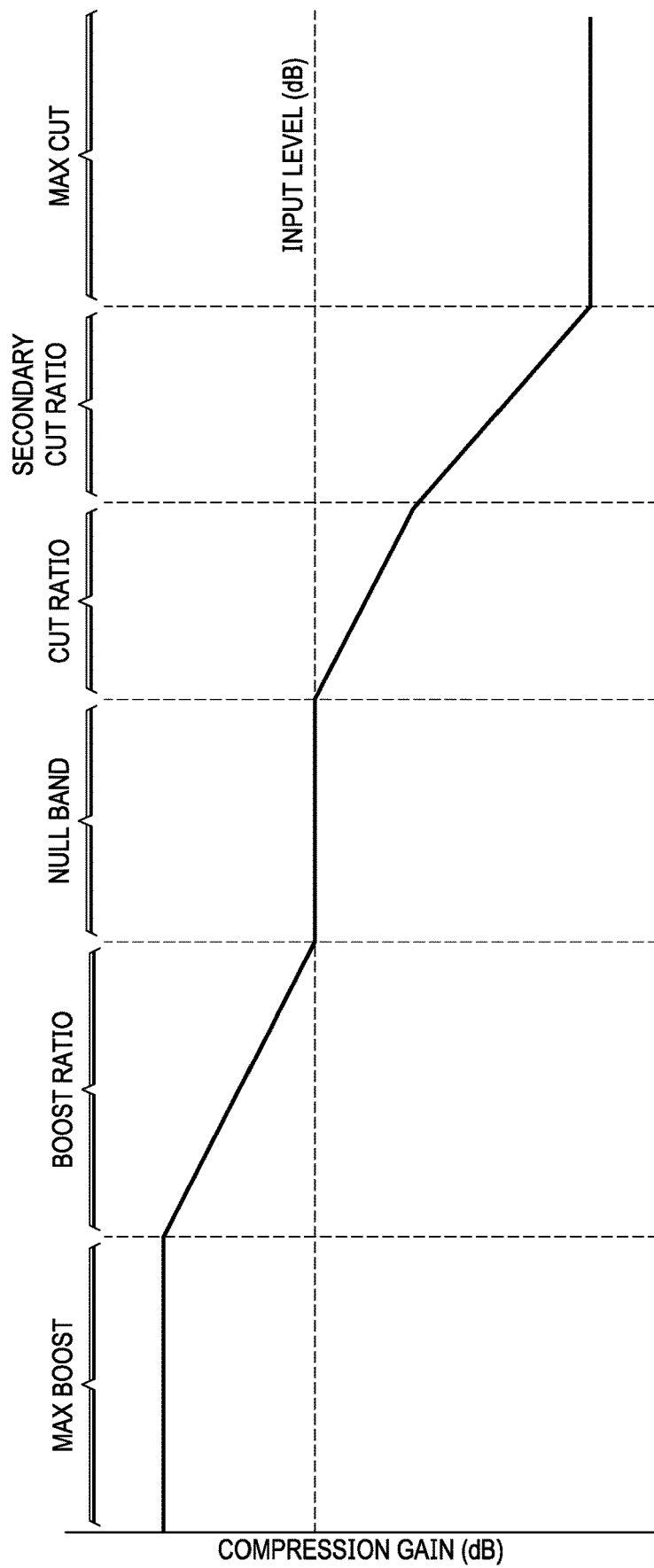
FIG. 2A and FIG. 2B illustrate example dynamic range compression curves.
Figure 2B:
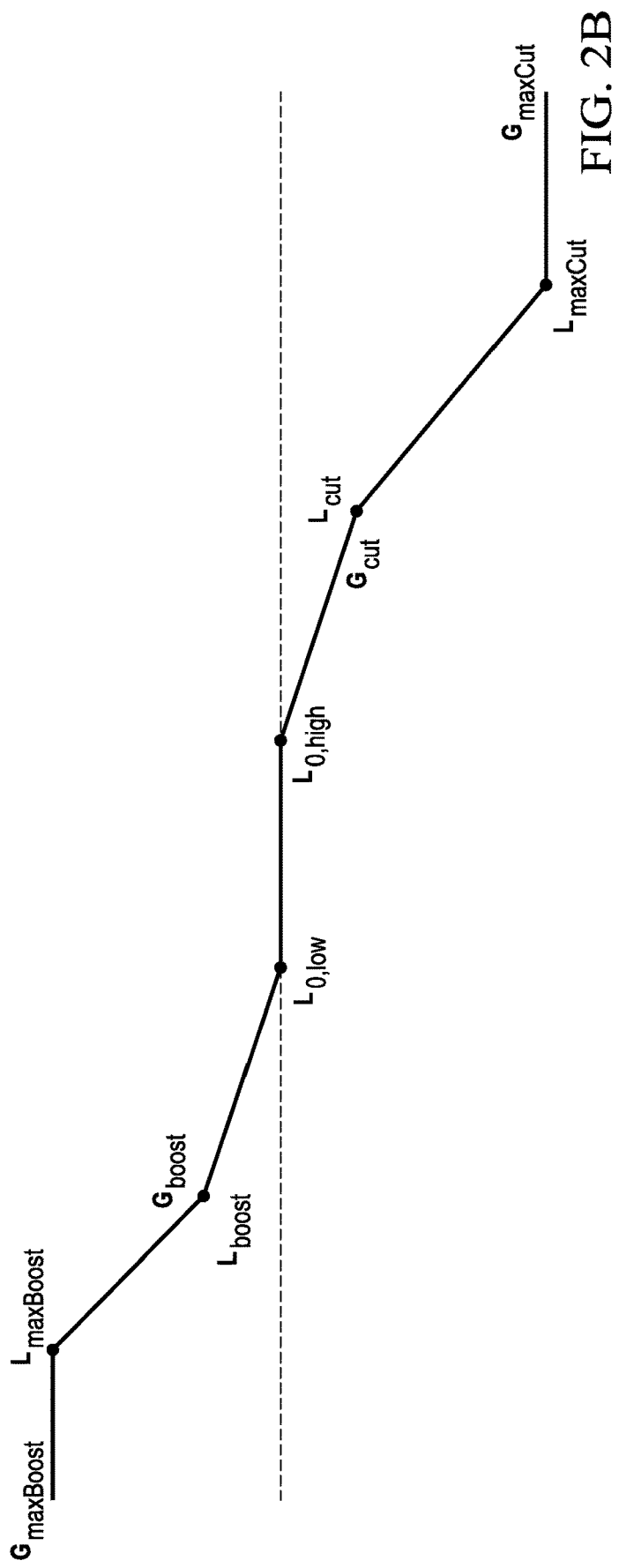

FIG. 2A and FIG. 2B illustrate example dynamic range compression curves that can be used by the DRC gain unit (104) in the decoder (100) to derive the DRC gains from input loudness levels. As illustrated, a dynamic range compression curve may be centered around a reference loudness level in a program in order to provide overall gains that are appropriate for the specific playback environment. Example definition data (e.g., in the metadata of the encoded audio signal 102, etc.) of the dynamic range compression curve (e.g., including but not limited only to any of: boost ratios, cut ratios, attack times, release times, etc.) are shown in the following table, where each profile in a plurality of profiles (e.g., film standard, film light, music standard, music light, speech, etc.) represents a specific playback environment (e.g., at the decoder 100, etc.):

TABLE 1

| Parameter | Profile | | | | |
|---|---|---|---|---|---|
| | Film standard | Film light | Music Standard | Music light | Speech |
| Time Constant Selection | | | | | |
| Attack Threshold (dB) | 15 | 15 | 15 | 15 | 10 |
| Release Threshold (dB) | 20 | 20 | 20 | 20 | 10 |
| Fast Attack Time Constant (ms) | 10 | 10 | 10 | 10 | 10 |
| Slow Attack Time Constant (ms) | 100 | 100 | 100 | 100 | 100 |
| Slow Release Time Constant (ms) | 3000 | 3000 | 10000 | 3000 | 1000 |
| Fast Release Time Constant (ms) | 1000 | 1000 | 1000 | 1000 | 200 |
| Holdoff period (ms) | 53 | 53 | 53 | 53 | 53 |
| Compression Curve | | | | | |
| Maximum Boost (dB) | 6 | 6 | 12 | 12 | 15 |
| Maximum Boost Range (<=dB) | −43 | −53 | −55 | −65 | −50 |
| Boost Ratio | 2:1 | 2:1 | 2:1 | 2:1 | 19:15 |
| Boost Range (dB) | [−43, . . . , −31] | [−53, . . . , −41] | [−55, . . . , −31] | [−65, . . . , −41] | [−50, . . . , −31] |
| Null Band Width (dB) | 5 | 20 | 5 | 20 | 5 |
| Null Band Range (dB) | [−31, . . . , −26] | [−41, . . . , −21] | [−31, . . . , −26] | [−41, . . . , −21] | [−31, . . . , −26] |
| Cut Ratio | 2:1 | 2:1 | 2:1 | 2:1 | 2:1 |
| Cut Ratio Range (dB) | [−26, . . . , −16] | [−21, . . . , −11] | [−26, . . . , −16] | [−21, . . . , 27] | [−26, . . . , −16] |
| Secondary Cut Ratio | 20:19 | 20:19 | 20:19 | | 20:19 |
| Secondary Cut Ratio Range (dB) | [−16, . . . , 4] | [−11, . . . , 9] | [−16, . . . , 4] | | [−16, . . . , 4] |
| Maximum Cut (dB) | −24 | −24 | −24 | −24 | −24 |
| Maximum Cut Range (>=dB) | 4 | 9 | 4 | 27 | 4 |

Audio content to be encoded into an encoded audio signal as described herein may be received in one or more of a variety of source audio formats in one or more of a variety of ways, such as wirelessly, via a wired connection, through a file, via an internet download, etc.

An encoded audio signal as described herein can be a part of an overall media data bitstream (e.g., for an audio broadcast, an audio program, an audiovisual program, an Some embodiments may receive one or more compression curves described in terms of loudness levels in $dB_{SPL}$, or $dB_{FS}$ and gains in dB relating to $dB_{SPL}$, whereas DRC gain calculation is performed in a different loudness representation that has a non-linear relation with $dB_{SPL}$, loudness levels (e.g. Sone). The compression curve used in the DRC gain calculation may then be converted to be described in terms of the different loudness representation (e.g. Sone).

6. DRC Gains, Gain Limiting and Gain Smoothing

Figure 3:
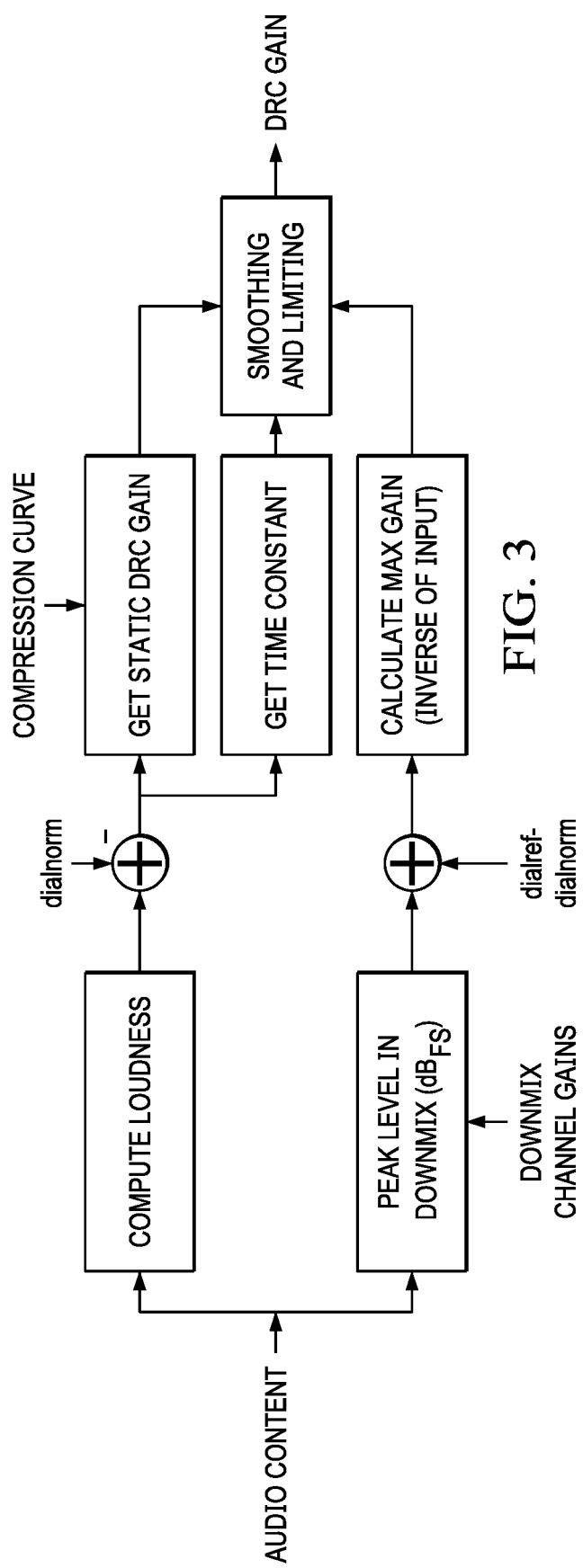
FIG. 3 illustrates example processing logic of determination/calculation of combined DRC and limiting gains.

FIG. 3 illustrates example processing logic of determination/calculation of combined DRC and limiting gains. The processing logic may be implemented by the decoder (100), the encoder (150), etc. For the purpose of illustration only, a DRC gain unit (e.g., 114) in a decoder (e.g., 100, etc.) may be used to implement the processing logic.

A DRC gain for a portion (e.g., one or more of audio data blocks, audio data frames, etc.) of audio content may be calculated using a loudness level determined from the portion of audio content. The loudness level may be first adjusted with respect to (e.g., in relation to, etc.) a dialogue loudness level (e.g., in a program of which the audio content is a part, etc.) in the metadata extracted from the encoded audio signal (102). In an example as illustrated in FIG. 3, a difference between the loudness level of the portion of audio content and the dialogue loudness level ("dialnorm") may be used as an input to look up the DRC gain from the selected dynamic range compression curve.

In order to prevent clipping in the output audio data elements in the specific playback environment, the DRC gain unit (114) may be configured to handle peak levels in a specific playback scenario (e.g., specific to the particular combination of the encoded audio signal 102 and the playback environment at the decoder 100, etc.), which may be one in a variety of possible playback scenarios (e.g., multi-channel scenarios, downmix scenarios, etc.).

In some embodiments, individual peak levels for individual portions of the audio content at a particular time resolution (e.g., audio data block, several audio data blocks, an audio data frame, etc.) may be provided as a part of the metadata extracted from the encoded audio signal (102).

In some embodiments, the DRC gain unit (114) can be configured to determine the peak level in these scenarios and adjusts the DRC gains if necessary. During the calculation of the DRC gain, a parallel process may be used by the DRC gain unit (114) to determine the peak level of the audio content. For example, the audio content may be encoded for a reference multi-channel configuration that has more channels than those of a specific speaker configuration used by the decoder (100). The audio content for the more channels of the reference multi-channel configuration may be converted into a downmixed audio data (e.g., ITU stereo downmix, matrixed-surround compatible downmix, etc.) to drive the fewer channels for the specific speaker configuration at the decoder (100). In some embodiments, under a first approach, downmixing from the reference multi-channel configuration to the specific speaker configuration may be performed before determining and handle peak levels for the purpose of clipping prevention. Additionally, optionally, or alternatively, in some embodiments, under a second approach, downmix channel gains relating to downmixing the audio content may be used as a part of input to adjust, derive, compute, etc., the peak level for the specific speaker configuration. In an example embodiment, the downmix channel gains may be derived based at least in part on one or more downmix equations used to carry out the downmix operation from the reference multi-channel configuration to the specific speaker configuration in the playback environment at the decoder (100).

In some media applications, a reference dialogue loudness level (e.g., −31 dB$_{FS}$ in the "Line" mode, −20 dB$_{FS}$ in the "RF" mode, etc.) may be specified or assumed for the specific playback environment at the decoder (100). In some embodiments, users may be given control over setting or changing the reference dialogue loudness level at the decoder (100).

A dialogue loudness related gain may be applied to the audio content to adjust the (e.g., output) dialogue loudness level to the reference dialogue loudness level. The peak level should be adjusted accordingly to reflect this adjustment. In an example, the (input) dialogue loudness level may be −23 dB$_{FS}$. In a "Line" mode with a reference dialogue loudness level of −31 dB$_{FS}$, the adjustment to the (input) dialogue loudness level is −8 dB to produce an output dialogue loudness level at the reference dialogue loudness level. In the "Line" mode, the adjustment to the peak level is also −8 dB, the same as the adjustment to the dialogue loudness level. In an "RF" mode with a reference dialogue loudness level of −20 dB$_{FS}$, the adjustment to the (input) dialogue loudness level is 3 dB to produce an output dialogue loudness level at the reference dialogue loudness level. In the "RF" mode, the adjustment to the peak level is also 3 dB, the same as the adjustment to the dialogue loudness level.

A sum of the peak level and a difference between the reference dialogue loudness level (denoted as "dialref") and the dialogue loudness level ("dialnorm") in the metadata from the encoded audio signal (102) may be used as an input to compute a maximum (e.g., allowed, etc.) gain for the DRC gain. Since the adjusted peak level is expressed in dB$_{FS}$ (relative to the clipping level at 0 dB$_{FS}$), the maximum allowed gain without causing clipping (e.g., for the current audio data block, for the current audio data frame, etc.) is simply the inverse (e.g., multiplied with −1, etc.) of the adjusted peak level.

In some embodiments, the peak level may exceed a clipping level (denoted as 0 dB$_{FS}$), even if the dynamic range compression curve from which the DRC gain was derived is designed to cut loud sounds to a certain extent. In some embodiments, a combination of the adjustments to the dialogue loudness level and the DRC gain prevents clipping in the peak level, possibly even in the worst-case downmix (e.g., producing the largest downmix channel gains, etc.). However, in some other embodiments, the combination of the adjustments to the dialogue loudness level and the DRC gain may still not be sufficient in preventing clipping in the peak level. In these embodiments, the DRC gain may be replaced (e.g., capped, etc.) by the highest gain that does prevent clipping in the peak level.

In some embodiments, the DRC gain unit (114) is configured to get time constants (e.g., attack times, release times, etc.) from the metadata extracted from the encoded audio signal (102). These time constants may or may not vary with one or more of the dialogue loudness level or the current loudness level of the audio content. The DRC gain looked up from the dynamic range compression curve, the time constants, and the maximum gain may be used to perform gain smoothing and limiting operations.

In some embodiments, the DRC gain which may possibly be gain limited does not exceed the maximum peak loudness level in the specific playback environment. The static DRC gain derived from the loudness level may be smoothed with a filter controlled by a time constant. The limiting operations may be implemented by one or more min( ) functions, through which the (pre-limiting) DRC gain may be replaced immediately, over a short time interval, etc., with the maximum allowed gain, thereby preventing clipping. The DRC algorithm may be configured to smoothly release from the clipping gain to a lower gain as the peak levels of incoming audio content moves from above the clipping level to below the clipping level.

One or more different (e.g., real time, two-pass, etc.) implementations may be used to carry out the determination/calculation/application of DRC gains as illustrated in FIG. 3. For the purpose of illustration only, the adjustments to the dialogue loudness level, the (e.g., static, etc.) DRC gains, the time-dependent gain variations due to smoothing, gain clipping due to limiting, etc., have been described as combined gains from the DRC algorithm as described above. However, other approaches of applying gains to audio content for controlling dialogue loudness levels (e.g., between different programs, etc.), for dynamic range control (e.g., for different portions of the same program, etc.), for preventing clipping, for gain smoothing, etc., may be used in various embodiments. For example, some or all of the adjustments to the dialogue loudness level, the (e.g., static, etc.) DRC gains, the time-dependent gain variations due to smoothing, gain clipping due to limiting, etc., may be partially/individually applied, applied in series, applied in parallel, applied in part series in part parallel, etc.

7. Input Smoothing and Gain Smoothing

In addition to DRC gain smoothing, other smoothing processes under techniques as described herein may be implemented in various embodiments. In an example, input smoothing may be used to smooth input audio data extracted from the encoded audio signal (102), for example with a simple single pole smoothing filter, to obtain a spectrum of specific loudness levels that has better temporal characteristics (e.g., more smooth in time, less spiky in time, etc.) than a spectrum of specific loudness levels without input smoothing.

In some embodiments, different smoothing processes as described herein can use different time constants (e.g., 1 second, 4 seconds, etc.). In some embodiments, two or more smoothing processes can use a same time constant. In some embodiments, time constants used in smoothing processes as described herein can be frequency-dependent. In some embodiments, time constants used in smoothing processes as described herein can be frequency-independent.

One or more smoothing processes may be connected to a reset process that supports an automatic or manual reset of the one or more smoothing processes. In some embodiments, when a reset occurs in the reset process, a smoothing process may speed up smoothing operations by switching or transferring to a smaller time constant. In some embodiments, when a reset occurs in the reset process, the memory of a smoothing process may be reset to a certain value. This value may be the last input sample to the smoothing process.

8. DRC Over Multiple Frequency Bands

In some embodiments, specific loudness levels in specific frequency bands can be used to derive corresponding DRC gains in the specific frequency bands. This, however, may result in timbre changes as the specific loudness levels can vary significantly in different bands and thus incur different DRC gains, even as a broadband (or wideband) loudness level over all the frequency bands remains constant.

In some embodiments, rather than applying DRC gains that vary with individual frequency bands, DRC gains that do not vary with frequency bands but vary with time are applied instead. The same time-varying DRC gains are applied across all of the frequency bands. The time-averaged DRC gains of the time-varying DRC gains may be set to the same as static DRC gains derived from the selected dynamic range compression curve based on broadband, wideband, and/or overall loudness levels over a broadband (or wideband) range or a plurality of frequency bands. As a result, changes to the timbre effects that might be caused by applying different DRC gains in different frequency bands in other approaches can be prevented.

In some embodiments, DRC gains in individual frequency bands are controlled with a broadband (or wideband) DRC gain determined based on a broadband (or wideband) loudness level. The DRC gains in the individual frequency bands may operate around the broadband (or wideband) DRC gain looked up in dynamic range compression curve based on the broadband (or wideband) loudness level, so that the DRC gains in the individual frequency bands as time-averaged over a certain time interval (e.g., longer than 5.3 milliseconds, 20 milliseconds, 50 milliseconds, 80 milliseconds, 100 milliseconds, etc.) are the same as the broadband (or wideband) level as indicated in the dynamic range compression curve. In some embodiments, loudness level fluctuations over short time intervals relative to the certain time interval deviating from the time-averaged DRC gains are permissible among channels and/or frequency bands. The approach ensures the application of correct multi-channel and/or multiband time-averaged DRC gains as indicated in the dynamic range compression curve and prevents the DRC gains in the short time intervals from deviating too much from such time-averaged DRC gains as indicated in the dynamic range compression curve.

9. Volume Adjustment in Loudness Domain

Applying linear processing for volume adjustment to audio excitation signals under other approaches that do not implement techniques as described herein may cause low audible signal levels to become inaudible (e.g., falling below the frequency dependent hearing threshold of the human auditory system, etc.).

Under techniques as described herein, volume adjustments of audio content may be made or implemented in the loudness domain (e.g., with a Sone representation, etc.), rather than the physical domain (e.g., with a $dB_{SPL}$ representation, etc.). In some embodiments, loudness levels in all bands are scaled with the same factor in the loudness domain for the purpose of maintaining perceptual qualities and/or integrity of loudness level relationships among all the bands at all volume levels. The volume adjustments based on setting and adjusting gains in the loudness domain as described herein may be converted back to, and implemented through, non-linear processing in the physical domain (or in the digital domain representing the physical domain) that applies different scaling factors to audio excitation signals in different frequency bands. The non-linear processing in the physical domain, converted from the volume adjustments in the loudness domain under techniques as described herein, attenuates or enhances loudness levels of audio content with DRC gains that prevent most or all of low audible levels in the audio content from becoming inaudible. In some embodiments, loudness level differences between loud and soft sounds within a program are reduced—but not perceptually obliterated—with these DRC gains to maintain the low audible signal levels above the hearing threshold of the human auditory system. In some embodiments, at low volume levels, frequencies or frequency bands with excitation signal levels close to the threshold of hearing are less attenuated thus are perceptually audible, in order to maintain a similarity of spectral perception and perceived timbre, etc., across a large range of volume levels.

Techniques as described herein may implement conversions (e.g., back and forth, etc.) between signal levels, gains, etc. in the physical domain (or in the digital domain representing the physical domain) and loudness levels, gains, etc., in the loudness domain. These conversions may be based on forward and inverse versions of one or more non-linear functions (e.g., mappings, curves, piece-wise linear segments, look-up tables, etc.) constructed based on a model of the human auditory system.

10. Gain Profiles with Differential Gains

In some embodiments, an audio encoder (e.g., 150, etc.) as described herein is configured to provide profile related metadata to downstream audio decoders. For example, the profile related metadata may be carried in an encoded audio signal as a part of audio related metadata along with audio content.

The profile related metadata as described herein includes but is not limited to definition data for a plurality of gain profiles. One or more first gain profiles (denoted as one or more default gain profiles) in the plurality of gain profiles are represented by one or more corresponding DRC curves (denoted as one or more default DRC curves), whose definition data is included in the profile related metadata. One or more second gain profiles (denoted as one or more non-default gain profiles) in the plurality of gain profiles are represented by one or more corresponding sets of differential gains, whose definition data is included in the profile related metadata, in relation to the one or more default DRC curves. More specifically, a default DRC curve (e.g., in the profile related metadata, etc.) can be used to represent a default gain profile; a set of differential gains (e.g., in the profile related metadata, etc.) in relation to a default gain profile can be used to represent a non-default gain profile.

In some embodiments, a set of differential gains—which represents a non-default gain profile in relation to a default DRC curve representing a default gain profile—comprises gain differences (or gain adjustments) between a set of non-differential (e.g., non-default, etc.) gains generated for the non-default gain profile and a set of non-differential (e.g., default, etc.) gains generated for the default gain profile. Examples of non-differential gains include but are not limited only to: any of null gain, DRC gains or attenuations, gains or attenuations relating to dialog normalization, gains or attenuations relating to gain limiting, gains or attenuations relating to gain smoothing, etc. Gains (e.g., non-differential gains, differential gains, etc.) as described herein may be time-dependent and may have values that vary with time.

To generate a set of non-differential gains for a gain profile (e.g., a default gain profile, a non-default gain profile, etc.), an audio encoder as described herein may perform a set of gain generation operations specific to the gain profile. The set of gain generation operations may comprise DRC operations, gain limiting operations, gain smoothing operations, etc., including but not limited to: any of operations (1) globally applicable to all gain profiles; (2) specific to one or more but not all gain profiles, specific to one or more default DRC curves; (3) specific to one or more non-default DRC curves; (4) specific to the corresponding (e.g., default, non-default, etc.) gain profile; (5) related to one or more of algorithms, curves, functions, operations, parameters, etc., that exceed the limit of parameterization supported by a media coding format, a media standard, a media proprietary specification, etc.; (6) related to one or more of algorithms, curves, functions, operations, parameters, etc., that are not yet popularly implemented in audio decoding devices in the field; etc.

In some embodiments, the audio encoder (150) can be configured to determine a set of differential gains for the audio content (152) based at least in part on a default gain profile represented by a default DRC curve (e.g., with definition data in the profile related metadata of the encoded audio signal, etc.) and a non-default gain profile that is different from the default gain profile, and include the set of differential gains as a representation (e.g., in relation to the default DRC curve, etc.) of the non-default gain profile as a part of the profile related metadata in the encoded audio signal. The set of differential gains as extracted from the profile related metadata in the encoded audio signal, in relation to the default DRC curve, can be used by a recipient audio decoder to efficiently and consistently perform gain operations (or attenuation operations) in a playback environment or scenario for a specific gain profile represented by the set of differential gains in relation to the default DRC curve. This allows the recipient audio decoder to apply gains or attenuations for the specific gain profile without requiring the recipient audio decoder to implement a set of gain generation operations, which can be implemented in the audio encoder (150), to generate the gains or attenuations.

In some embodiments, one or more sets of differential gains may be included by the audio encoder (150) in the profile related metadata. Each of the one or more sets of differential gains may be derived from a corresponding non-default gain profile in one or more non-default gain profiles in relation to a corresponding default gain profile in one of one or more default gain profiles. For example, a first set of differential gains in the one or more sets of differential gains may be derived from a first non-default gain profile in relation to a first default gain profile, whereas a second set of differential gains in the sets of differential gains may be derived from a second non-default gain profile in relation to a second default gain profile.

In some embodiments, the first set of differential gains comprises first gain differences (or gain adjustments) determined between a first set of non-differential non-default gains generated based on the first non-default gain profile and a first set of non-differential default gains generated based on the first default gain profile, whereas the second set of differential gains comprises second gain differences determined between a second set of non-differential non-default gains generated based on the second non-default gain profile and a second set of non-differential default gains generated based on the second default gain profile.

The first default gain profile and the second default gain profile may be same (e.g., represented by the same default DRC curve with the same set of gain generation operations, etc.) or different (e.g., represented by different default DRC curves, represented by a default DRC curve with different sets of gain generation operations, etc.). In various embodiments, additionally, optionally, or alternatively, the first non-default gain profile may or may not be the same as the second non-default gain profile.

The profile related metadata generated by the audio encoder (150) can carry one or more specific flags, indicators, data fields, etc., to indicate the presence of one or more sets of differential gains for one or more corresponding non-default gain profiles. The profile related data may also include a preference flag, indicator, data field, etc., to indicate which non-default gain profile is preferred for rendering the audio content in a specific playback environment or scenario.

In some embodiments, an audio decoder (e.g., 100, etc.) described herein is configured to decode (e.g., multi-channel, etc.) audio content from the encoded audio signal (102), extracts a dialog loudness level (e.g., "dialnorm", etc.) from loudness metadata delivered with the audio content, etc.

In some embodiments, an audio decoder (e.g., 100, etc.) is configured to perform at least one set of gain generation operations for a gain profile such as the first default profile, the second default profile, etc. For example, the audio decoder (100) can decode the encoded audio signal (102) with a dialog loudness level (e.g., "dialnorm", etc.); perform a set of gain generation operations to obtain a set of non-differential default gains (or attenuations) for a default gain profile represented by a default DRC curve whose definition data can be extracted by the audio decoder (100) from the encoded audio signal (102); apply the set of non-differential default gains (e.g., a difference between a reference loudness level and "dialnorm", etc.) for the default gain profile during decoding to align/adjust an output dialog loudness level of sound output to the reference loudness level; etc.

Additionally, optionally, or alternatively, in some embodiments, the audio decoder (100) is configured to extract at least one set of differential gains, which represents a non-default gain profile in relation to a default DRC curve such as discussed above, as a part of metadata delivered with the audio content, from the encoded audio signal (102). In some embodiments, the profile related metadata comprises one or more different sets of differential gains—each of the one or more different sets of differential gains represents a non-default gain profile in relation to a respective default DRC curve representing a default gain profile. The presence of a DRC curve or a set of differential gains in the profile related metadata may be indicated by one or more flags, indicators, data fields carried in the profile related metadata.

In response to determining that the one or more sets of differential gains are present, the audio decoder (100) can determine/select a set of differential gains, among the one or more different sets of differential gains, that corresponds to a specific non-default gain profile. The audio decoder (100) can be further configured to identify a default DRC curve— for example, among definition data for one or more different default DRC curves in the profile related metadata—in relation to which the set of differential gains represents the specific gain profile.

In some embodiments, the audio decoder (100) is configured to perform a set of gain generation operations to obtain a set of non-differential default gains (or attenuations) for the default gain profile. The set of gain generation operations performed by the audio decoder (100) to obtain the set of non-differential default gains based on the default DRC curve may comprise one or more operations relating to one or more of standards, proprietary specifications, etc. In some embodiments, the audio decoder (100) is configured to generate a set of non-differential non-default gains for the specific non-default gain profiles based on the set of differential gains whose definition data is extracted from the profile related metadata and the set of non-differential default gains generated by the set of gain generation operations based on the default DRC curve; apply the set of non-differential non-default gains (e.g., a difference between a reference loudness level and "dialnorm", etc.) for the non-default gain profile during decoding to align/adjust an output dialog loudness level of sound output to the reference loudness level; etc.

In some embodiments, the audio decoder (100) is capable of performing gain related operations for one or more gain profiles. The audio decoder (100) can be configured to determine and perform gain related operations for a specific gain profile based on one or more factors. These factors may include, but are not limited only to: one or more of user input that specifies a preference for a specific user-selected gain profile, user input that specifies a preference for a system-selected gain profile, capabilities of a specific speaker or audio channel configuration used by the audio decoder (100), capabilities of the audio decoder (100), availability of profile related metadata for the specific gain profile, any encoder-generated preference flag for a gain profile, etc. In some embodiments, the audio decoder (100) may implement one or more precedence rules, may solicit further user input, etc., to determine or select a specific gain profile if these factors conflict among themselves.

11. Additional Operations Related to Gains

Under techniques as described herein, other processing such as dynamic equalization, noise compensation, etc., can also be performed in the loudness (e.g., perceptual) domain, rather than in the physical domain (or a digital domain representing the physical domain).

In some embodiments, gains from some or all of a variety of processing such as DRC, equalization noise compensation, clip prevention, gain smoothing, etc., may be combined in the same gains in the loudness domain and/or may be applied in parallel. In some other embodiments, gains from some or all of a variety of processing such as DRC, equalization noise compensation, clip prevention, gain smoothing, etc., may be in separate gains in the loudness domain and/or may be applied in series at least in part. In some other embodiments, gains from some or all of a variety of processing such as DRC, equalization noise compensation, clip prevention, gain smoothing, etc., may be applied in order.

12. Specific and Broadband (or Wideband) Loudness Levels

One or more audio processing elements, units, components, etc., such as transmission filters, auditory filterbank, synthesis filterbank, short-time-Fourier transform, etc., may be used by an encoder or decoder to perform audio processing operations as described herein.

In some embodiments, one or more transmission filters that model the outer and middle ear filtering of the human auditory system may be used to filter an incoming audio signal (e.g., an encoded audio signal 102, audio content from a content provider, etc.). In some embodiments, an auditory filterbank may be used to model the frequency selectivity and frequency spread of the human auditory system. Excitation signal levels from some or all of these filters may be determined/calculated and smoothed with frequency dependent time constants that are shorter towards higher frequencies to model the integration of energy in the human auditory system. Subsequently, a non-linear function (e.g., relation, curve, etc.) between excitation signals and specific loudness levels may be used to obtain a profile of frequency-dependent specific loudness levels. A broadband (or wideband) loudness level can be obtained by integrating the specific loudness over frequency bands.

A straightforward (e.g., with equal weight to all frequency bands, etc.) summation/integration of specific loudness levels may work well for broadband signals. However, such an approach may underestimate (e.g., perceptual, etc.) loudness levels for narrowband signals. In some embodiments, specific loudness levels in different frequencies or in different frequency bands are given different weights.

In some embodiments, the auditory filterbanks and/or the transmission filters as mentioned above may be replaced by one or more Short-Time Fourier Transforms (STFT). Responses of the transmission filter and auditory filterbank may be applied in a Fast Fourier Transform (FFT) domain. In some embodiments, one or more inverse transmission filters are used, for example, when one or more (e.g., forward, etc.) transmission filters are used in or before the conversion from the physical domain (or in the digital domain representing the physical domain) to the loudness domain. In some embodiments, inverse transmission filters are not used, for example, when the STFT is used in place of auditory filterbanks and/or transmission filters. In some embodiments, auditory filterbank are omitted; instead, one or more quadrature mirror filters (QMF) are used. In these embodiments, the spreading effect of the basilar membrane in the model of the human auditory system may be omitted without significantly affecting the performance of the audio processing operations as described herein.

Under techniques as described herein, different numbers of frequency bands (e.g., 20 frequency bands, 40 perceptual bands, etc.) may be used in various embodiments. Additionally, optionally or alternatively, different bandwidth widths may also be used in various embodiments.

13. Individual Gains for Individual Subsets of Channels

In some embodiments, when a specific speaker configuration is a multi-channel configuration, an overall loudness levels may be obtained by first summing excitation signals of all channels before the conversion from the physical domain (or in the digital domain representing the physical domain) to the loudness domain. However, applying the same gains to all channels in the specific speaker configuration may not preserve spatial balance among the different channels (e.g., in terms of relative loudness levels between different channels, etc.) of the specific speaker configuration.

In some embodiments, to preserve the spatial balance such that relative perceptual loudness levels among different channels may be optimally or correctly maintained, respective loudness levels and corresponding gains obtained based on the respective loudness levels may be determined or calculated per channel. In some embodiments, the corresponding gains obtained based on the respective loudness levels do not equal the same overall gain; for example, each of some or all of the corresponding gains may equals to the overall gain plus a (e.g., channel-specific) small correction.

In some embodiments, to preserve the spatial balance, respective loudness levels and corresponding gains obtained based on the respective loudness levels may be determined or calculated per subset of channels. In some embodiments, the corresponding gains obtained based on the respective loudness levels do not equal the same overall gain; for example, each of some or all of the corresponding gains may equals to the overall gain plus a (e.g., channel-specific) small correction. In some embodiments, a subset of channels may comprise two or more channels (e.g., a subset of channels comprising left front, right front, and low frequency effect (LFE); a subset of channels comprising left surround and right surround; etc.) forming a proper subset of all channels in the specific speaker configuration. Audio content for the subset of channels may constitute a submix of an overall mix carried in the encoded audio signal (102). The channels within a submix can be applied with the same gains.

In some embodiments, to produce actual loudness (e.g., actually perceived, etc.) from a specific speaker configuration, one or more calibration parameters may be used to relate signal levels in a digital domain to the corresponding physical (e.g., spatial pressure in terms of $dB_{SPL}$, etc.) levels in a physical domain represented by the digital domain. The one or more calibration parameters may be given values that are specific to physical sound equipment in the specific speaker configuration.

14. Auditory Scene Analysis

In some embodiments, an encoder as described herein may implement computer-based auditory scene analysis (ASA) to detect auditory event boundaries in audio content (e.g., encoded into the encoded audio signal 102, etc.), generate one or more ASA parameters format the one or more ASA parameters as a part of an encoded audio signal (e.g., 102, etc.) to be delivered to downstream devices (e.g., decoder 100, etc.). The ASA parameters may include but are not limited only to: any of parameters indicating locations of the auditory event boundaries, values of an auditory event certainty measure (as will be further explained below), etc.

In some embodiments, a (e.g., time-wise) location of an auditory event boundary may be indicated in metadata encoded within the encoded audio signal (102). Additionally, optionally, or alternatively, a (e.g., time-wise) location of an auditory event boundary may be indicated (e.g., with a flag, a data field, etc.) in an audio data block and/or frame at which the location of the auditory event boundary is detected.

As used herein, an auditory event boundary refers to a point at which a preceding auditory event ends and/or a succeeding auditory event begins. Each auditory event occurs between two consecutive auditory event boundaries.

In some embodiments, the encoder (150) is configured to detect auditory event boundaries by differences in specific loudness spectra between two (e.g., time-wise, etc.) consecutive audio data frames. Each of the specific loudness spectra may comprise a spectrum of unsmoothed loudness computed from a corresponding audio data frame of the consecutive audio data frames.

In some embodiments, a specific loudness spectrum N [b, t] may be normalized to obtain a normalized specific loudness spectrum $N_{NORM}$[b, t] as shown in the following expression:

$$N_{NORM}[b, t] = \frac{N[b, t]}{\max_{b}\{N[b, t]\}} \quad (1)$$

where b indicates a band, t indicates a time or an audio data frame index, and $$\max_{b}\{N[b, t]\}$$

is the maximum specific loudness level across all frequency bands.

Normalized specific loudness spectra may be subtracted from each other and used to derive summed absolute differences, D[t], as shown in the following expression:

$$D[t] = \Sigma_b |N_{NORM}[b,t] - N_{NORM}[b,t-1]| \qquad (2)$$

The summed absolute differences are mapped to an auditory event certainty measure A[t] with a value range of 0 to 1 as follows:

$$A[t] = \begin{cases} 0 & D[t] \leq D_{min} \\ \dfrac{D[t] - D_{min}}{D_{max} - D_{min}} & D_{min} < D[t] < D_{max} \\ 1 & D[t] \geq D_{max} \end{cases} \qquad (3)$$

where $D_{min}$ and $D_{max}$ are minimum and maximum thresholds (e.g., user configurable, system configurable, set in relation to past value distribution of D[t] in the audio content, etc.).

In some embodiments, the encoder (150) is configured to detect an auditory event boundary (e.g., a specific t, etc.) when D[t] (e.g., at the specific t, etc.) rises above $D_{min}$.

In some embodiments, a decoder (e.g., 100, etc.) as described herein extracts the ASA parameters from an encoded audio signal (e.g., 102, etc.) and use the ASA parameters to prevent unintentional boosting of soft sounds and/or unintentional cutting of loud sounds that cause perceptual distortions of auditory events.

The decoder (100) may be configured to reduce or prevent unintentional distortions of auditory events by ensuring that within an auditory event the gain is more nearly constant and by confining much of the gain change to the neighborhood of an auditory event boundary. For example, the decoder (100) may be configured to use a relatively small time constant (e.g., comparable with or shorter than a minimum duration of auditory events, etc.) in response to a gain change in an attack (e.g., loudness level increasing, etc.) at an auditory event boundary. Accordingly, the gain change in the attack can be implemented by the decoder (100) relatively rapidly. On the other hand, the decoder (100) may be configured to use a relatively long time constant relative to a duration of an auditory event in response to a gain change in a release (e.g., loudness level decreasing, etc.) in an auditory event. Accordingly, the gain change in the release can be implemented by the decoder (100) relatively slowly so that sounds that ought to appear constant or to decay gradually may not be audibly or perceptually disturbed. The quick response in an attack at an auditory event boundary and the slow response in a release in an auditory event allow a fast perception of an arrival of the auditory event and preserve perceptual qualities and/or integrity during the auditory event—which comprises loud and soft sounds linked by specific loudness level relationships and/or specific time relationships—such as a piano chord, etc.

In some embodiments, auditory events and auditory event boundaries indicated by the ASA parameters are used by the decoder (100) to control gain changes in one, two, some or all of the channels in a specific speaker configuration at the decoder (100).

15. Loudness Level Transitions

Loudness level transitions may occur, for example, between two programs, between a program and a loud commercial, etc. In some embodiments, decoder (100) is configured to maintain a histogram of instantaneous loudness levels based on past audio content (e.g., received from the encoded audio signal 102, for the past 4 seconds, etc.). Over a time interval from before a loudness level transition to after the loudness level transition, two areas with heightened probabilities may be recorded in the histogram. One of the areas centers around a previous loudness level, whereas the other the areas centers around a new loudness level.

The decoder (100) may dynamically determine a smoothed loudness level as the audio content is being processed, and determine a corresponding bin (e.g., a bin of instantaneous loudness levels that include the same value as the smoothed loudness level, etc.) of the histogram based on the smoothed loudness level. The decoder (100) is further configured to compare a probability at the corresponding bin with a threshold (e.g., 6%, 7%, 7.5%, etc.), where the total area (e.g. the sum of all bins) of the histogram curve represents a probability of 100%. The decoder can be configured to detect the occurrence of the loudness level transition by determining that the probability at the corresponding bin falls below the threshold. In response, the decoder (100) may be configured to select a relatively small time constant to adapt relatively fast to the new loudness level. Consequently, time durations of loud (or soft) onsets within loudness level transitions can be reduced.

In some embodiments, the decoder (100) uses a silence/noise gate to prevent low instantaneous loudness levels from entering into the histogram and becoming a high probability bin in the histogram. Additionally, optionally or alternatively, the decoder (100) may be configured to use the ASA parameters to detect auditory events to be included in the histogram. In some embodiments, the decoder (100) may determine time-dependent values of a time-averaged auditory event certainty measure $\overline{A}[t]$ from the ASA parameters. In some embodiments, the decoder (100) may determine time-dependent values of an (e.g., instantaneous, etc.) auditory event certainty measure A[t] from the ASA parameters and compute values of a time-averaged auditory event certainty measure A[t] based on the time-dependent values of an (e.g., instantaneous, etc.) auditory event certainty measure A[t] from the ASA parameters, etc. The decoder (100) may be configured to exclude loudness levels from entering the histogram if the time-averaged auditory event certainty measure $\overline{A}[t]$ contemporaneous with the loudness levels fall below a histogram inclusion threshold value (e.g., 0.1, 0.12, etc.).

In some embodiments, for (e.g., instantaneous, etc.) loudness levels (e.g., corresponding $\overline{A}[t]$ values are above the histogram inclusion threshold value, etc.) permitted to be included in the histogram, the loudness levels are assigned weights that are the same as, proportional to, etc., time dependent values of the time-averaged auditory event certainty measure $\overline{A}[t]$ contemporaneous with the loudness levels. As a result, loudness levels near an auditory event boundary have more influence on the histogram (e.g., $\overline{A}[t]$ has relatively large values, etc.) than other loudness levels that are not near an auditory event boundary.

16. Reset

In some embodiments, an encoder as described herein (e.g., 150, etc.) is configured to detect reset events and include indications of the reset events in an encoded audio signal (e.g., 102, etc.) generated by the encoder (150). In a first example, the encoder (150) detects a reset event in response to determining that there occurs a continuous (e.g., 250 milliseconds, configurable by a system and/or a user, etc.) period of relative silence. In a second example, the encoder (150) detects a reset event in response to determining that there occurs a large instantaneous drop in excitation level across all frequency bands. In a third example the encoder is provided with input (e.g. metadata, user input, system controlled, etc.) where transitions in content (e.g. program start/end, scene change, etc.) occur that require a reset.

In some embodiments, a decoder as described herein (e.g., 100, etc.) implements a reset mechanism that can be used to instantaneously speed up gain smoothing. The reset mechanism is useful and may be invoked when switching between channels or audiovisual inputs occurs.

In some embodiments, the decoder (100) can be configured to determine whether a reset event occurs by determining whether there occurs a continuous (e.g., 250 milliseconds, configurable by a system and/or a user, etc.) period of relative silence, whether there occurs a large instantaneous drop in excitation level across all frequency bands, etc.

In some embodiments, the decoder (100) can be configured to determine that a reset event occurs in response to receiving an indication (e.g., of the reset event, etc.) that was provided in an encoded audio signal (102) by an upstream encoder (e.g., 150, etc.).

The reset mechanism may be caused to issue a reset when the decoder (100) determining that a reset event occurs. In some embodiments, the reset mechanism is configured to use a slightly more aggressive cut behavior of the DRC compression curve to prevent hard onsets (e.g., of a loud program/channel/audiovisual source, etc.). Additionally, optionally, or alternatively, the decoder (100) may be configured to implement safeguards to recover gracefully when the decoder (100) detects that a reset is falsely triggered.

17. Encoder-Provided Gains

In some embodiments, the audio encoder can be configured to compute one or more sets of gains (e.g., DRC gains, etc.) for individual portions (e.g., audio data blocks, audio data frames, etc.) of the audio content to be encoded into the encoded audio signal. The sets of gains generated by the audio encoder may comprise one or more of: a first set of gains comprising a single broadband (or wideband) gain for all channels (e.g., left front, right front, low frequency effect or LFE, center, left surround, right surround, etc.); a second set of gains comprising individual broadband (or wideband) gains for individual subsets of channels; a third set of gains comprising individual broadband (or wideband) gains for individual subsets of channels and for each of a first number (e.g., two, etc.) of individual bands (e.g., two bands in each channel, etc.); a fourth set of gains comprising individual broadband (or wideband) gains for individual subsets of channels and for each of a second number (e.g., four, etc.) of individual bands (e.g., four bands in each channel, etc.); etc. A subset of channels as described herein may be one of a subset comprising left front, right front and LFE channels, a subset comprising a center channel, a subset comprising left surround and right surround channels, etc.

Figure 4:
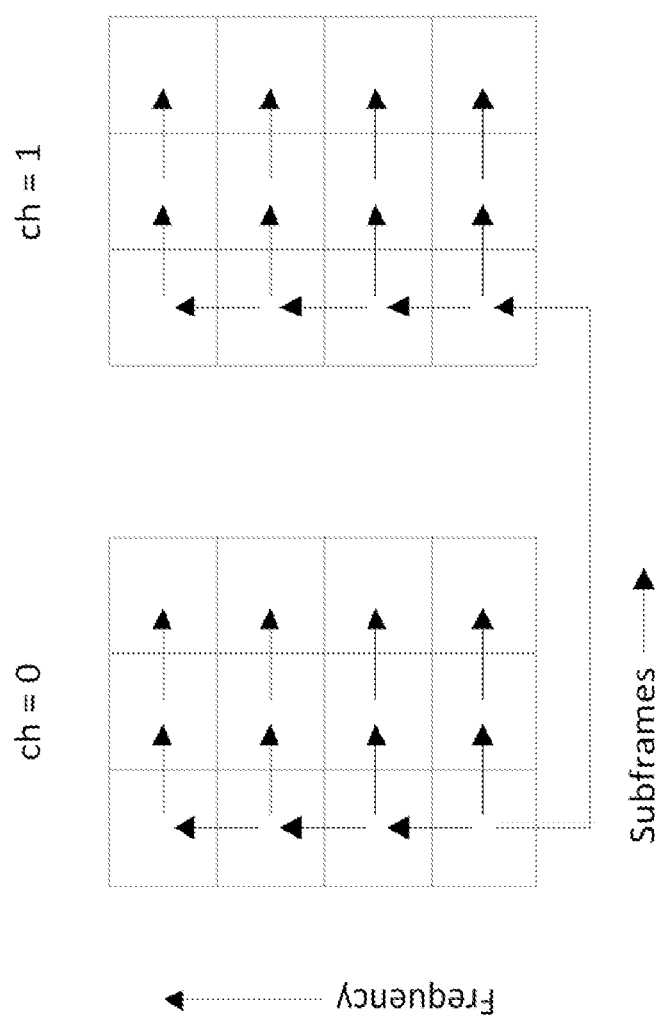
FIG. 4 illustrates example differential coding of gains.

In some embodiments, the audio encoder is configured to transmit one or more portions (e.g., audio data blocks, audio data frames, etc.) of the audio content and one or more sets of gains computed for the one or more portions of the audio content in a time-synchronous manner. An audio decoder that receives the one or more portions of the audio content can select and apply a set of gains among the one or more sets of gains with little or no delay. In some embodiments, the audio encoder can implement sub-framing techniques under which the one or more sets of gains are carried (e.g., with differential coding, etc.) in one or more sub-frames as illustrated in FIG. 4. In an example, the sub-frames may be encoded within the audio data blocks or audio data frames for which the gains are computed. In another example, the sub-frames may be encoded within audio data blocks or audio data frames preceding the audio data blocks or audio data frames for which the gains are computed. In another non-limiting example, the sub-frames may be encoded within audio data blocks or audio data frames within a certain time from the audio data blocks or audio data frames for which the gains are computed. In some embodiments, Huffman and differential coding may be used to populate and/or compress the sub-frames that carry the sets of gains.

18. Example System and Process Flows

Figure 5:
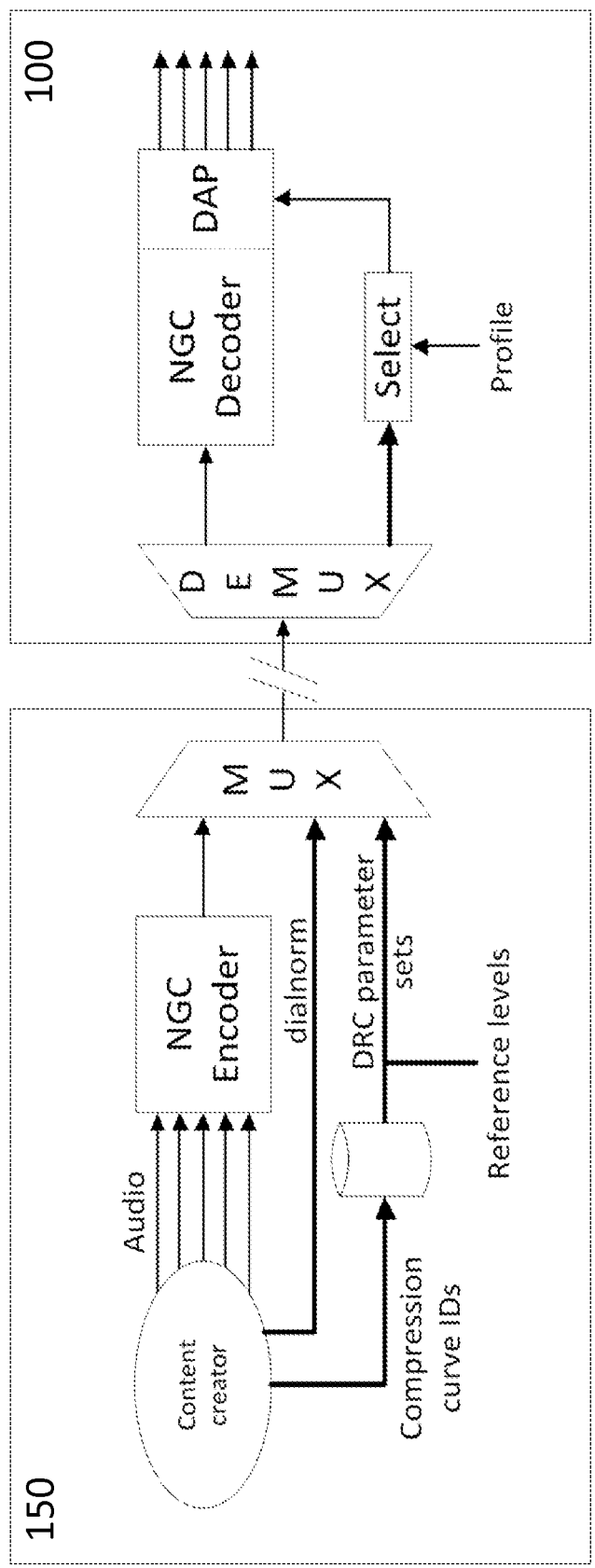
FIG. 5 illustrates an example codec system comprising an audio encoder and an audio decoder.

FIG. 5 illustrates an example codec system in a non-limiting example embodiment. A content creator, which may be a processing unit in an audio encoder such as 150, etc., is configured to provide audio content ("Audio") to an encoder unit ("NGC Encoder"). The encoder unit formats the audio content into audio data blocks and/or frames and encodes the audio data blocks and/or frames into an encoded audio signal. The content creator is also configured to establish/generate one or more dialog loudness levels ("dialnorm") of one or more programs, commercials, etc., in the audio content and one or more dynamic range compression curve identifiers ("Compression curve IDs"). The content creator may determine the dialog loudness levels from one or more dialogue audio tracks in the audio content. The dynamic range compression curve identifiers may be selected based at least in part on user input, system configuration parameters, etc. The content creator may be a person (e.g. artist, audio engineer, etc.) using tools to generate the audio content and dialnorm.

Based on the dynamic range compression curve identifiers, the encoder (150) generates one or more DRC parameter sets including but not limited to corresponding reference dialogue loudness levels ("Reference levels") for a plurality of playback environments supported by the one or more dynamic range compression curves. These DRC parameter sets may be encoded in-band with the audio content, out-of-band with the audio content, etc., in metadata of the encoded audio signal. Operations such as compression, formatting multiplexing ("MUX"), etc., may be performed as a part of generating the encoded audio signal that may be delivered to an audio decoder such as 100, etc. An encoded audio signal may be encoded with a syntax that supports carriage of audio data elements, DRC parameter sets, reference loudness levels, dynamic range compression curves, functions, lookup tables, Huffman codes used in compression, sub-frames, etc. In some embodiments, the syntax allows an upstream device (e.g., an encoder, a decoder, a transcoder, etc.) to transmit gains to a downstream device (e.g., a decoder, a transcoder, etc.). In some embodiments, the syntax used to encode data into and/or decode the data from an encoded audio signal is configured to support backward compatibility such that a device that relies on gains computed by an upstream device may optionally continue to do so.

In some embodiments, the encoder (150) computes one, two or more sets of gains (e.g., DRC gains, gain smoothing, with appropriate reference dialogue loudness levels, etc.) for the audio content. The sets for gains may be provided with the one or more dynamic range compression curves in the metadata encoded with the audio content into the encoded audio signal. A first set of gains may correspond to a broadband (or wideband) gain for all channels in a (e.g., default, etc.) speaker configuration or profile. A second set of gains may correspond to a broadband (or wideband) gain for each of the all channels in the speaker configuration or profile. A third set of gains may correspond to a broadband (or wideband) gain for each of two bands in each of the all channels in the speaker configuration or profile. A fourth set of gains may correspond to a broadband (or wideband) gain for each of four bands in each of the all channels in the speaker configuration or profile. In some embodiments, the sets of gains computed for a speaker configuration may be transmitted with a (e.g., parameterized, etc.) dynamic range compression curve for the speaker configuration in the metadata. In some embodiments, the sets of gains computed for a speaker configuration may replace a (e.g., parameterized, etc.) dynamic range compression curve for the speaker configuration in the metadata. Additional speaker configurations or profiles may be supported under techniques as described herein.

The decoder (100) is configured to extract the audio data blocks and/or frames and the metadata from the encoded audio signals, for example, through operations such as decompression, deformatting, demultiplexing ("DEMUX"), etc. The extracted audio data blocks and/or frames may be decoded by a decoder unit ("NGC Decoder") into audio data elements or samples. The decoder (100) is further configured to determine a profile for a specific playback environment at the decoder (100), in which the audio content is to be rendered, and select a dynamic range compression curve from the metadata extracted from the encoded audio signal. A digital audio processing unit ("DAP") is configured to apply DRC and other operations on the audio data elements or samples for the purpose of generating audio signals that drive audio channels in the specific playback environment. The decoder (100) can calculate and apply DRC gains based on loudness levels determined from audio data blocks or frames and the selected dynamic range compression curve. The decoder (100) can also adjust the output dialogue loudness level based on a reference dialogue loudness level associated with the selected dynamic range compression curve and the dialogue loudness levels in the metadata extracted from the encoded audio signal. The decoder (100) can subsequently apply gain limiter that is specific to a playback scenario as related to the audio content and the specific playback environment. Thus, the decoder (100) can render/play the audio content as tailored to the playback scenario.

Figure 5A:
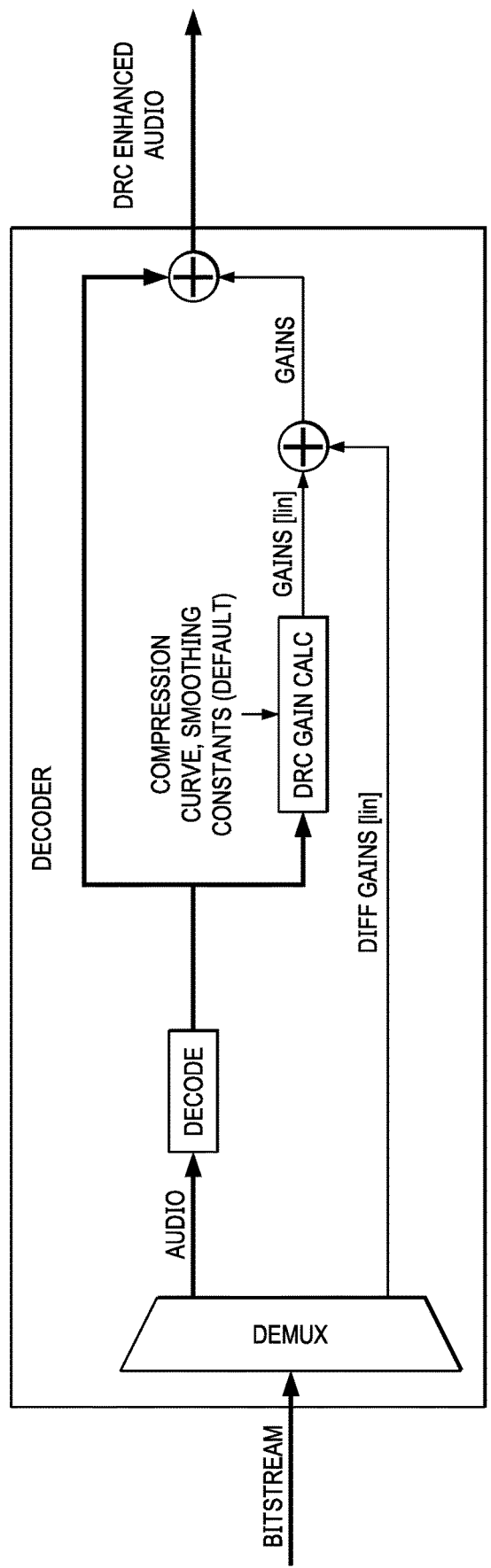
FIG. 5A illustrates an example audio decoder.

FIG. 5A illustrates another example decoder (which may be the same as decoder 100 of FIG. 5). As shown in FIG. 5A, the decoder of FIG. 5A is configured to extract the audio data blocks and/or frames and the metadata from the encoded audio signals, for example, through operations such as decompression, deformatting, demultiplexing ("DEMUX"), etc. The extracted audio data blocks and/or frames may be decoded by a decoder unit ("Decode") into audio data elements or samples. The decoder of FIG. 5A is further configured to perform DRC gain calculations based on a default compression curve, smoothing constants relating to the default compression curve, etc., to a set of default gains. The decoder of FIG. 5A is further configured to extract a set of differential gains for a non-default gain profile from profile related metadata in the metadata, determine a set of non-differential gains for the non-default gain profile at the decoder of FIG. 5A, in which the audio content is to be rendered, apply the set of non-differential gains and other operations on the audio data elements or samples for the purpose of generating DRC enhanced audio output that drives audio channels in the specific playback environment. Thus, the decoder of FIG. 5A can render/play the audio content according to the non-default gain profile even if the decoder of FIG. 5A itself may or may not have implemented support for performing a set of gain generation operations to obtain a set of non-differential gains directly for the non-default gain profile.

FIG. 6A through FIG. 6D illustrate example process flows. In some embodiments, one or more computing devices or units in a media processing system may perform this process flow.

Figure 6A:
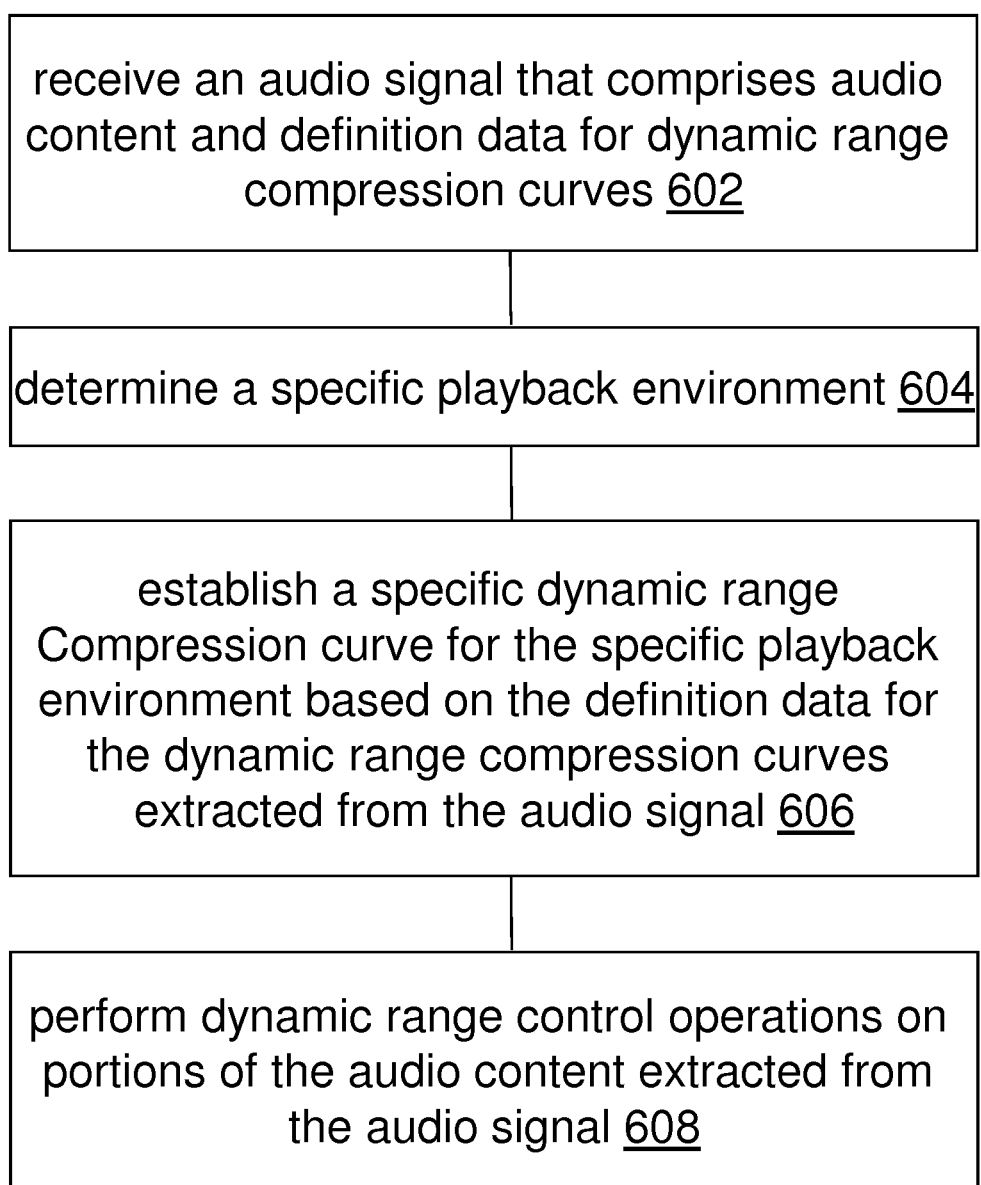

FIG. 6A illustrates an example process flow that may be implemented by an audio decoder as described herein. In block 602 of FIG. 6A, a first device (e.g., an audio decoder 100 of FIG. 1A, etc.) receives an audio signal that comprises audio content and definition data for one or more dynamic range compression curves.

In block 604, the first device determines a specific playback environment.

In block 606, the first device establishes a specific dynamic range compression curve for the specific playback environment based on the definition data for the one or more dynamic range compression curves extracted from the audio signal.

In block 608, the first device performs one or more dynamic range control (DRC) operations on one or more portions of the audio content extracted from the audio signal. The one or more DRC operations being based at least in part on one or more DRC gains obtained from the specific dynamic range compression curve.

In an embodiment, the definition data for the one or more dynamic range compression curves comprises one or more of attack times, release times, or reference loudness levels related to at least one of the one or more dynamic range compression curves.

In an embodiment, the first device is further configured to perform: computing one or more loudness levels for the one or more portions of the audio content; determining the one or more DRC gains based on the specific dynamic range compression curve and the one or more loudness levels for the one or more portions of the audio content; etc.

In an embodiment, at least one of the loudness levels computed for the one or more portions of the audio content is one or more of specific loudness levels relating to one or more frequency bands, broadband loudness levels across a broadband range, wideband loudness levels across a wideband range, broadband loudness levels across a plurality of frequency bands, wideband loudness levels across a plurality of frequency bands, etc.

In an embodiment, at least one of the loudness levels computed for the one or more portions of the audio content is one or more of instantaneous loudness levels or loudness levels smoothed over one or more time intervals.

In an embodiment, the one or more operations comprise one or more operations related to one or more of adjusting dialog loudness levels, gain smoothing, gain limiting, dynamic equalization, noise compensation, etc.

In an embodiment, the first device is further configured to perform: extracting one or more dialogue loudness levels from the encoded audio signal; adjusting the one or more dialogue loudness levels to one or more reference dialogue loudness levels; etc.

In an embodiment, the first device is further configured to perform: extracting one or more auditory scene analysis (ASA) parameters from the encoded audio signal; changing one or more time constants used in smoothing gains applied to the audio content, the gains relating to one or more of the one or more DRC gains, gain smoothing, or gain limiting; etc.

In an embodiment, the first device is further configured to perform: determining that a reset event occurs in the one or more portions of the audio content based on an indication of a reset event, the indication of the reset being extracted from the encoded audio signal; in response to determining that the reset event occurs in the one or more portions of the audio content, taking one or more actions on one or more gain smoothing operations being performed at a time of determining that the reset event occurs in the one or more portions of the audio content; etc.

In an embodiment, the first device is further configured to perform: maintaining a histogram of instantaneous loudness levels, the histogram being populated by instantaneous loudness levels computed from a time interval in the audio content; determining whether a specific loudness level is above a threshold in a high probability area of the histogram, the specific loudness level being computed from a portion of the audio content; in response to determining that the specific loudness level is above the threshold in the high probability area of the histogram, performing determining that a loudness transition occurs, shortening a time constant used in gain smoothing to speed up the loudness transition, etc.; etc.

Figure 6B:
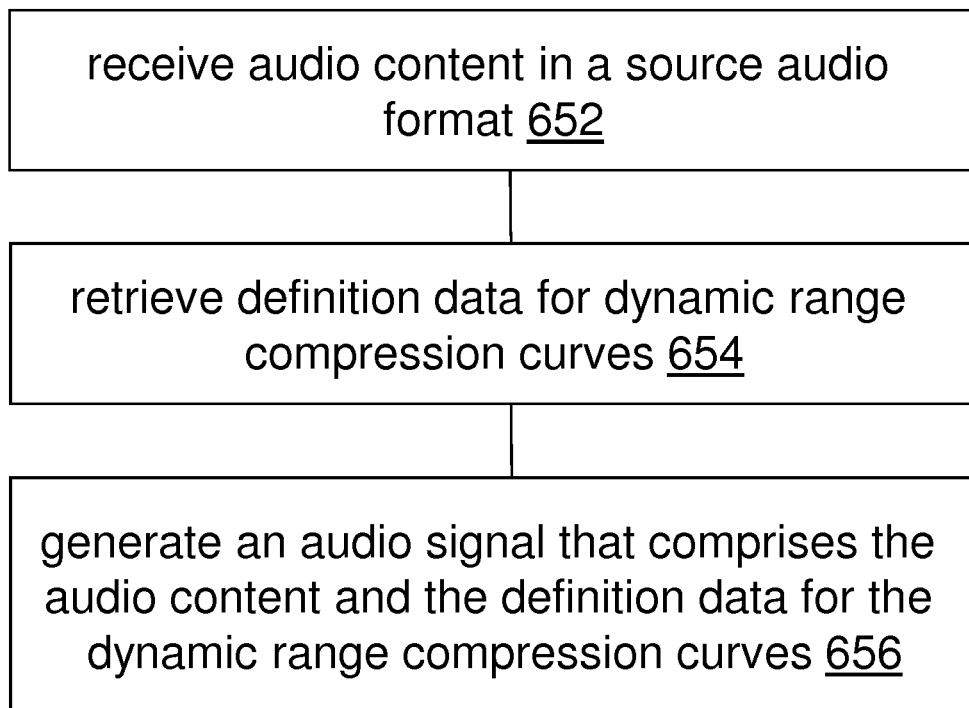

FIG. 6B illustrates an example process flow that may be implemented by an audio encoder as described herein. In block 652 of FIG. 6B, a second device (e.g., an audio encoder 150 of FIG. 1B, etc.) receives audio content in a source audio format.

In block 654, the second device retrieves definition data for one or more dynamic range compression curves.

In block 656, the second device generates an audio signal that comprises the audio content and the definition data for the one or more dynamic range compression curves.

In an embodiment, the second device is further configured to perform: determining one or more identifiers for the one or more dynamic range compression curves; retrieving the definition data for the one or more dynamic range compression curves from a reference data repository based on the one or more identifiers; etc.

In an embodiment, the second device is further configured to perform: computing one or more dialogue loudness levels for the one or more portions of the audio content; encoding the one or more dialogue loudness levels with the one or more portions of the audio content into the encoded audio signal; etc.

In an embodiment, the second device is further configured to perform: performing auditory event scene (ASA) on the one or more portions of the audio content; generating one or more ASA parameters based on results of the ASA on the one or more portions of the audio content; encoding the one or more ASA parameters with the one or more portions of the audio content into the encoded audio signal; etc.

In an embodiment, the second device is further configured to perform: determining that one or more reset events occur in the one or more portions of the audio content; encoding one or more indications of the one or more reset events with the one or more portions of the audio content into the encoded audio signal; etc.

In an embodiment, the second device is further configured to encode the one or more portions of the audio content into one or more audio data frames or audio data blocks.

In an embodiment, a first DRC gain of the one or more DRC gains applies to each channel in a first proper subset in a set of all channels in a specific speaker configuration that corresponds to the specific playback environment, whereas a second different DRC gain of the one or more DRC gains applies to each channel in a second proper subset in the set of all channels in the specific speaker configuration that corresponds to the specific playback environment.

In an embodiment, a first DRC gain of the one or more DRC gains applies to a first frequency band, whereas a second different DRC gain of the one or more DRC gains applies to a second different frequency band.

In an embodiment, the one or more portions of the audio content comprise one or more of audio data frames or audio data blocks. In an embodiment, the encoded audio signal is a part of an audiovisual signal.

In an embodiment, the one or more DRC gains are defined in a loudness domain.

FIG. 6C illustrates an example process flow that may be implemented by an audio decoder as described herein. In block 662 of FIG. 6C, a third device (e.g., an audio decoder 100 of FIG. 1A, an audio decoder of FIG. 5, an audio decoder of FIG. 5A, etc.) receives an audio signal that comprises audio content and definition data for one or more dynamic range compression (DRC) curves and one or more sets of differential gains.

In block 664, the third device identifies a specific set of differential gains, among the one or more sets of differential gains, for a gain profile in a specific playback environment; the third device also identifies a default DRC curve, among the one or more DRC curves, related to the specific set of differential gains.

In block 666, the third device generates a set of default gains based at least in part on the default DRC curve.

In block 668, based at least in part on a combination of the set of default gains and the specific set of differential gains, the third device performs one or more operations on one or more portions of the audio content extracted from the audio signal.

In an embodiment, the set of default gains comprises non-differential gains generated by performing a set of gain generation operations based at least in part on the default DRC curve.

In an embodiment, the default DRC curve represents a default gain profile. In an embodiment, the specific set of differential gains in relation to the default DRC curve represents a non-default gain profile. In an embodiment, the audio signal comprises no definition data for a non-default DRC curve corresponding to the non-default gain profile.

In an embodiment, the specific set of differential gains comprise gain differences between a set of non-differential non-default gains generated for a non-default gain profile and a set of non-differential default gains generated for the default gain profile represented by the default DRC curve. The set of non-differential non-default gains and the set of non-differential default gains may be generated by an upstream audio decoder that encodes the audio signal.

In an embodiment, at least one set of the set of non-differential non-default gains or the set of non-differential default gains is not provided as a part of the audio signal.

Figure 6D:
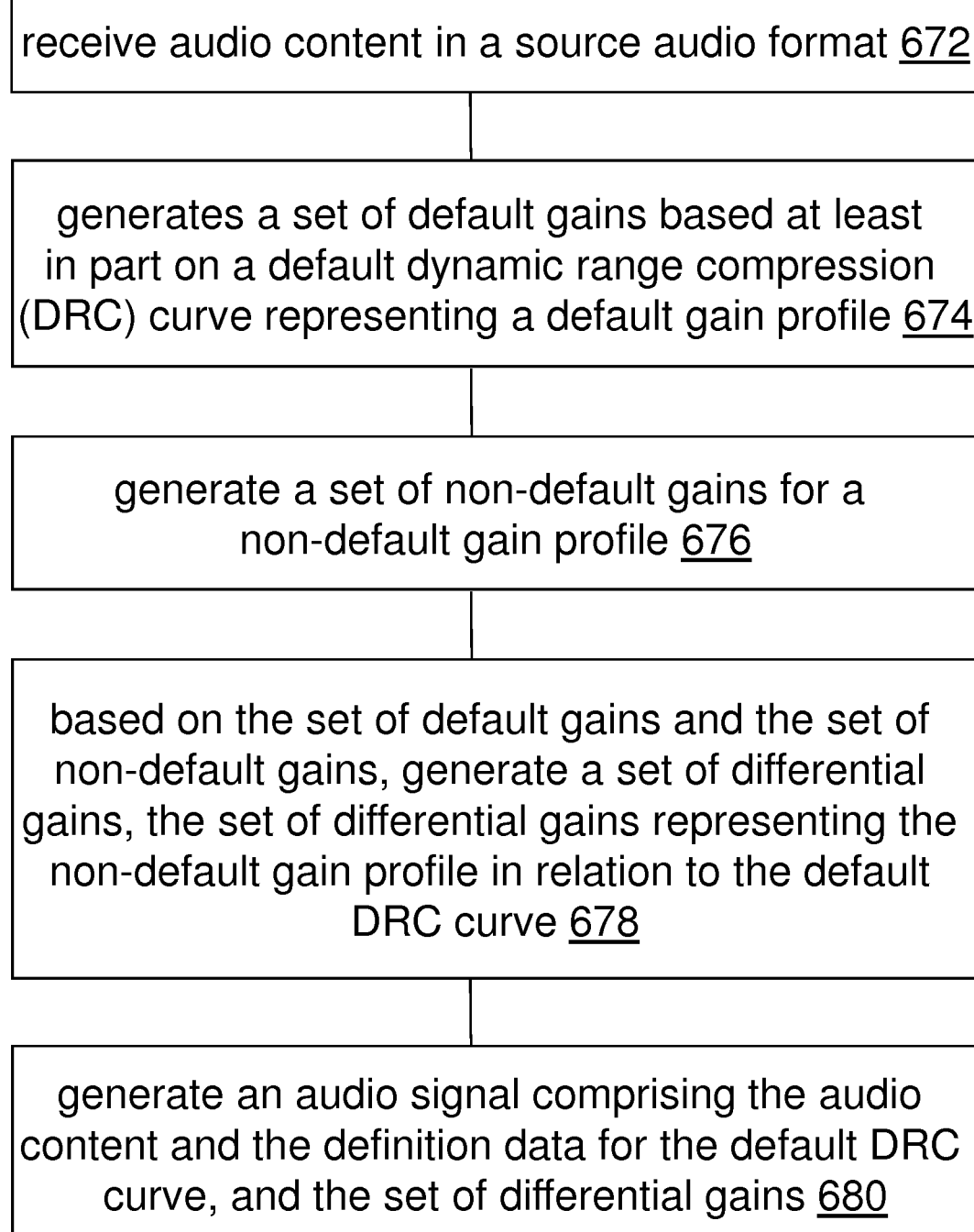

FIG. 6D illustrates an example process flow that may be implemented by an audio decoder as described herein. In block 672 of FIG. 6D, a fourth device (e.g., an audio encoder 150 of FIG. 1A, an audio encoder of FIG. 5, etc.) receives audio content in a source audio format;

In block 674, the fourth device generates a set of default gains based at least in part on a default dynamic range compression (DRC) curve representing a default gain profile.

In block 676, the fourth device generates a set of non-default gains for a non-default gain profile.

In block 678, based at least in part on the set of default gains and the set of non-default gains, the fourth device generates a set of differential gains, the set of differential gains representing the non-default gain profile in relation to the default DRC curve.

In block 680, the fourth device generates an audio signal that comprises the audio content and the definition data for one or more DRC curves and for one or more sets of differential gains, the one or more DRC curves including the default DRC curve, the one or more sets of differential gains including the set of differential gains.

In some embodiment, the non-default gain profile is represented by a DRC curve. In an embodiment, the audio signal comprises no definition data for the DRC curve representing the non-default gain profile. In some embodiments, the non-default gain profile is not represented by a DRC curve.

In an embodiment, an apparatus comprising a processor and configured to perform any one of the methods as described herein.

In an embodiment, a non-transitory computer readable storage medium, comprising software instructions, which when executed by one or more processors cause performance of any one of the methods as described herein. Note that, although separate embodiments are discussed herein, any combination of embodiments and/or partial embodiments discussed herein may be combined to form further embodiments.

19. Implementation Mechanisms—Hardware Overview

According to one embodiment, the techniques described herein are implemented by one or more special-purpose computing devices. The special-purpose computing devices may be hard-wired to perform the techniques, or may include digital electronic devices such as one or more application-specific integrated circuits (ASICs) or field programmable gate arrays (FPGAs) that are persistently programmed to perform the techniques, or may include one or more general purpose hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. The special-purpose computing devices may be desktop computer systems, portable computer systems, handheld devices, networking devices or any other device that incorporates hard-wired and/or program logic to implement the techniques.

Figure 7:
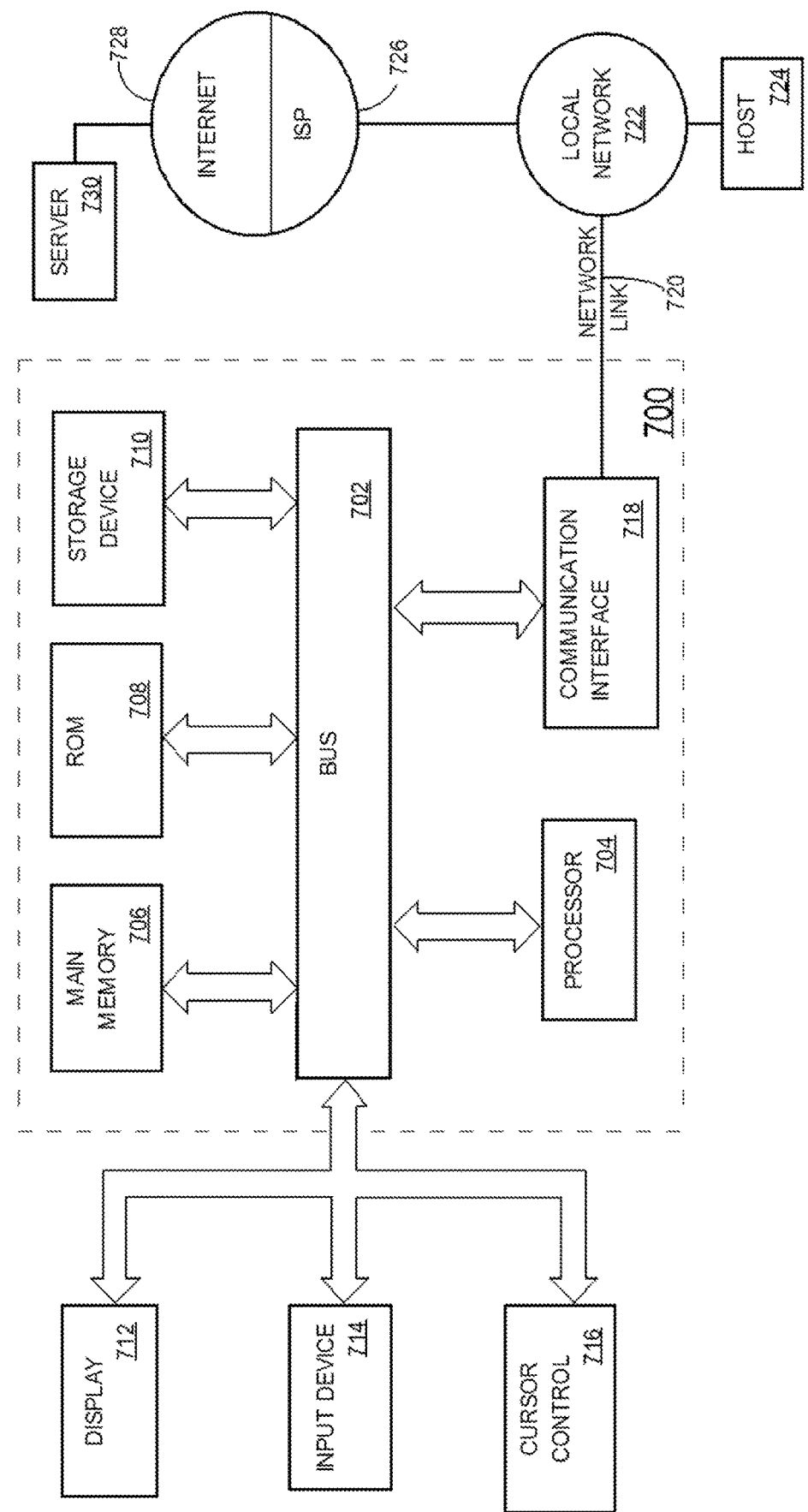
FIG. 7 illustrates an example hardware platform on which a computer or a computing device as described herein may be implemented.

For example, FIG. 7 is a block diagram that illustrates a computer system 700 upon which an embodiment of the invention may be implemented. Computer system 700 includes a bus 702 or other communication mechanism for communicating information, and a hardware processor 704 coupled with bus 702 for processing information. Hardware processor 704 may be, for example, a general purpose microprocessor.

Computer system 700 also includes a main memory 706, such as a random access memory (RAM) or other dynamic storage device, coupled to bus 702 for storing information and instructions to be executed by processor 704. Main memory 706 also may be used for storing temporary variables or other intermediate information during execution of instructions to be executed by processor 704. Such instructions, when stored in non-transitory storage media accessible to processor 704, render computer system 700 into a special-purpose machine that is device-specific to perform the operations specified in the instructions.

Computer system 700 further includes a read only memory (ROM) 708 or other static storage device coupled to bus 702 for storing static information and instructions for processor 704. A storage device 710, such as a magnetic disk or optical disk, is provided and coupled to bus 702 for storing information and instructions.

Computer system 700 may be coupled via bus 702 to a display 712, such as a liquid crystal display (LCD), for displaying information to a computer user. An input device 714, including alphanumeric and other keys, is coupled to bus 702 for communicating information and command selections to processor 704. Another type of user input device is cursor control 716, such as a mouse, a trackball, or cursor direction keys for communicating direction information and command selections to processor 704 and for controlling cursor movement on display 712. This input device typically has two degrees of freedom in two axes, a first axis (e.g., x) and a second axis (e.g., y), that allows the device to specify positions in a plane.

Computer system 700 may implement the techniques described herein using device-specific hard-wired logic, one or more ASICs or FPGAs, firmware and/or program logic which in combination with the computer system causes or programs computer system 700 to be a special-purpose machine. According to one embodiment, the techniques herein are performed by computer system 700 in response to processor 704 executing one or more sequences of one or more instructions contained in main memory 706. Such instructions may be read into main memory 706 from another storage medium, such as storage device 710. Execution of the sequences of instructions contained in main memory 706 causes processor 704 to perform the process steps described herein. In alternative embodiments, hard-wired circuitry may be used in place of or in combination with software instructions.

The term "storage media" as used herein refers to any non-transitory media that store data and/or instructions that cause a machine to operation in a specific fashion. Such storage media may comprise non-volatile media and/or volatile media. Non-volatile media includes, for example, optical or magnetic disks, such as storage device 710. Volatile media includes dynamic memory, such as main memory 706. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire and fiber optics, including the wires that comprise bus 702. Transmission media can also take the form of acoustic or light waves, such as those generated during radio-wave and infra-red data communications.

Various forms of media may be involved in carrying one or more sequences of one or more instructions to processor 704 for execution. For example, the instructions may initially be carried on a magnetic disk or solid state drive of a remote computer. The remote computer can load the instructions into its dynamic memory and send the instructions over a telephone line using a modem. A modem local to computer system 700 can receive the data on the telephone line and use an infra-red transmitter to convert the data to an infra-red signal. An infra-red detector can receive the data carried in the infra-red signal and appropriate circuitry can place the data on bus 702. Bus 702 carries the data to main memory 706, from which processor 704 retrieves and executes the instructions. The instructions received by main memory 706 may optionally be stored on storage device 710 either before or after execution by processor 704.

Computer system 700 also includes a communication interface 718 coupled to bus 702. Communication interface 718 provides a two-way data communication coupling to a network link 720 that is connected to a local network 722. For example, communication interface 718 may be an integrated services digital network (ISDN) card, cable modem, satellite modem, or a modem to provide a data communication connection to a corresponding type of telephone line. As another example, communication interface 718 may be a local area network (LAN) card to provide a data communication connection to a compatible LAN. Wireless links may also be implemented. In any such implementation, communication interface 718 sends and receives electrical, electromagnetic or optical signals that carry digital data streams representing various types of information.

Network link 720 typically provides data communication through one or more networks to other data devices. For example, network link 720 may provide a connection through local network 722 to a host computer 724 or to data equipment operated by an Internet Service Provider (ISP) 726. ISP 726 in turn provides data communication services through the world wide packet data communication network now commonly referred to as the "Internet" 728. Local network 722 and Internet 728 both use electrical, electromagnetic or optical signals that carry digital data streams. The signals through the various networks and the signals on network link 720 and through communication interface 718, which carry the digital data to and from computer system 700, are example forms of transmission media.

Computer system 700 can send messages and receive data, including program code, through the network(s), network link 720 and communication interface 718. In the Internet example, a server 730 might transmit a requested code for an application program through Internet 728, ISP 726, local network 722 and communication interface 718.

The received code may be executed by processor 704 as it is received, and/or stored in storage device 710, or other non-volatile storage for later execution.

20. Equivalents, Extensions, Alternatives and Miscellaneous

In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, feature, feature, advantage or attribute that is not expressly recited in a claim should limit the scope of such claim in any way. The specification and drawings are, accordingly, to be regarded in an illustrative rather than a restrictive sense.

What is claimed is:

1. A method for dynamic range control (DRC) of audio signals, the method comprising:
    receiving, by an audio decoder operating in a playback channel configuration different from a reference channel configuration, an audio signal for the reference channel configuration, the audio signal including audio sample data for each channel of the reference channel configuration, and encoder-generated DRC metadata, the encoder-generated DRC metadata comprising DRC gains for a plurality of channel configurations, including a set of DRC gains for the playback channel configuration and a set of DRC gains for the reference channel configuration;
    downmixing the audio sample data into downmixed audio sample data for the audio channels of the playback channel configuration;
    selecting, from the DRC gains for the plurality of channel configurations, the set of DRC gains for the playback channel configuration;
    applying the set of DRC gains for the playback channel configuration as a part of overall gains applied to the downmixed audio sample data to generate output audio sample data for each channel of the playback channel configuration;
    wherein the audio signal is organized into frames, each frame comprises one or more sub-frames, and the set of DRC gains for the playback channel configuration comprises one DRC gain per sub-frame.

2. A non-transitory computer readable storage medium, storing software instructions, which when executed by one or more processors cause performing:
    receiving, by an audio decoder operating in a playback channel configuration different from a reference channel configuration, an audio signal for the reference channel configuration, the audio signal including audio sample data for each channel of the reference channel configuration, and encoder-generated dynamic range control (DRC) metadata, the encoder-generated DRC metadata comprising DRC gains for a plurality of channel configurations, including a set of DRC gains for the playback channel configuration and a set of DRC gains for the reference channel configuration;
    downmixing the audio sample data into downmixed audio sample data for the audio channels of the playback channel configuration;
    selecting, from the DRC gains for the plurality of channel configurations, the set of DRC gains for the playback channel configuration; and
    applying the set of DRC gains for the playback channel configuration as a part of overall gains applied to the downmixed audio sample data to generate output audio sample data for each channel of the playback channel configuration;
    wherein the audio signal is organized into frames, each frame comprises one or more sub-frames, and the set of DRC gains for the playback channel configuration comprises one DRC gain per sub-frame.

3. An audio signal processing device for dynamic range control of audio signals, wherein the audio signal processing device comprises one or more processors configured to:
    receive, by an audio decoder operating in a playback channel configuration different from a reference channel configuration, an audio signal for the reference channel configuration, the audio signal including audio sample data for each channel of the reference channel configuration, and encoder-generated DRC metadata, the encoder-generated DRC metadata comprising DRC gains for a plurality of channel configurations, including a set of DRC gains for the playback channel configuration and a set of DRC gains for the reference channel configuration;

downmix the audio sample data into downmixed audio sample data for the audio channels of the playback channel configuration;

select, from the DRC gains for the plurality of channel configurations, the set of DRC gains for the playback channel configuration; and apply the set of DRC gains for the playback channel configuration as a part of overall gains applied to the downmixed audio sample data to generate output audio sample data for each channel of the playback channel configuration;

wherein the audio signal is organized into frames, each frame comprises one or more sub-frames, and the set of DRC gains for the playback channel configuration comprises one DRC gain per sub-frame.

* * * * *